United States Patent
Lee et al.

(10) Patent No.: US 11,158,701 B2
(45) Date of Patent: Oct. 26, 2021

(54) DIELECTRIC THIN FILM, MEMCAPACITOR INCLUDING THE SAME, CELL ARRAY INCLUDING THE SAME, AND MANUFACTURING METHOD THEREOF

(71) Applicant: Gwangju Institute of Science and Technology, Gwangju (KR)

(72) Inventors: Sanghan Lee, Gwangju (KR); Hyunji An, Gwangju (KR); Jiwoong Yang, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 16/691,904

(22) Filed: Nov. 22, 2019

(65) Prior Publication Data
US 2021/0151552 A1    May 20, 2021

(30) Foreign Application Priority Data
Nov. 15, 2019    (KR) .................. 10-2019-0146858

(51) Int. Cl.
*H01L 49/02*    (2006.01)
*H01L 45/00*    (2006.01)

(52) U.S. Cl.
CPC .............. *H01L 28/55* (2013.01); *H01L 28/60* (2013.01); *H01L 45/08* (2013.01); *H01L 45/1253* (2013.01); *H01L 45/147* (2013.01); *H01L 45/1641* (2013.01)

(58) Field of Classification Search
None
See application file for complete search history.

(56) References Cited

U.S. PATENT DOCUMENTS

| | | | |
|---|---|---|---|
| 6,518,609 B1* | 2/2003 | Ramesh | G11C 11/22 257/295 |
| 7,274,058 B2 | 9/2007 | Jae et al. | |
| 8,405,171 B2 | 3/2013 | Zheng et al. | |
| 8,969,169 B1* | 3/2015 | Chen | H01L 28/82 438/396 |
| 9,082,551 B2 | 7/2015 | Minoru et al. | |
| 9,909,233 B1 | 3/2018 | Ihlefeld et al. | |
| 10,804,294 B2 | 10/2020 | Hyangkeun | |
| 2011/0051310 A1 | 3/2011 | Strachan et al. | |

(Continued)

FOREIGN PATENT DOCUMENTS

| | | |
|---|---|---|
| JP | 2012-240884 | 12/2012 |
| KR | 10-0596391 | 7/2006 |

(Continued)

OTHER PUBLICATIONS

U.S. Appl. No. 16/697,542, filed Nov. 27, 2019, 56 pages.

(Continued)

*Primary Examiner* — Khaja Ahmad
(74) *Attorney, Agent, or Firm* — Finch & Maloney PLLC

(57) ABSTRACT

Provided is a memcapacitor. The memcapacitor includes: a first electrode having a metal-doped perovskite composition; a second electrode disposed on the first electrode; and a dielectric thin film having a perovskite composition, disposed between the first electrode and the second electrode, and having a variable dielectric constant depending on a voltage between the first electrode and the second electrode.

7 Claims, 27 Drawing Sheets

(56) References Cited

U.S. PATENT DOCUMENTS

| | | | |
|---|---|---|---|
| 2013/0149794 A1* | 6/2013 | Wang | H01L 21/02197 |
| | | | 438/3 |
| 2014/0113828 A1 | 4/2014 | Gilbert et al. | |
| 2014/0291599 A1 | 10/2014 | Sang | |
| 2015/0221658 A1* | 8/2015 | Wang | H01L 21/7687 |
| | | | 257/532 |
| 2015/0378243 A1 | 12/2015 | Kippelen et al. | |
| 2016/0111564 A1 | 4/2016 | Gidwani et al. | |
| 2019/0131426 A1* | 5/2019 | Lu | H01L 29/66795 |

FOREIGN PATENT DOCUMENTS

| | | |
|---|---|---|
| KR | 10-2014-0118176 | 10/2014 |
| KR | 10-1742384 | 6/2017 |
| KR | 10-2019-0109606 | 9/2019 |

OTHER PUBLICATIONS

Lee et al., "Strong polarization enhancement in asymmetric three-component ferroelectric superlattices", Nature 433, 395-399 (2005).

* cited by examiner

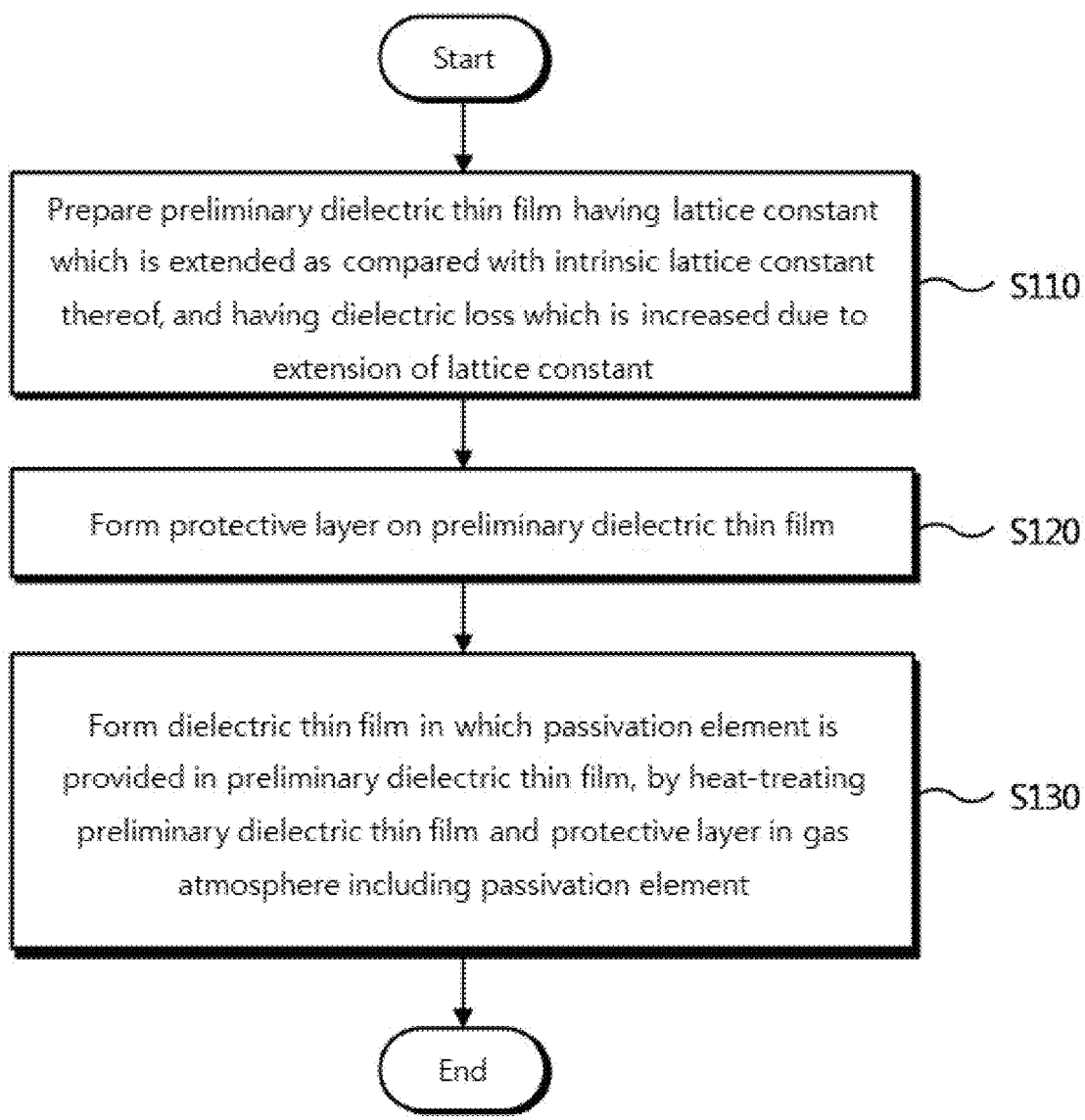

[FIG.2a]
[FIG.2b]
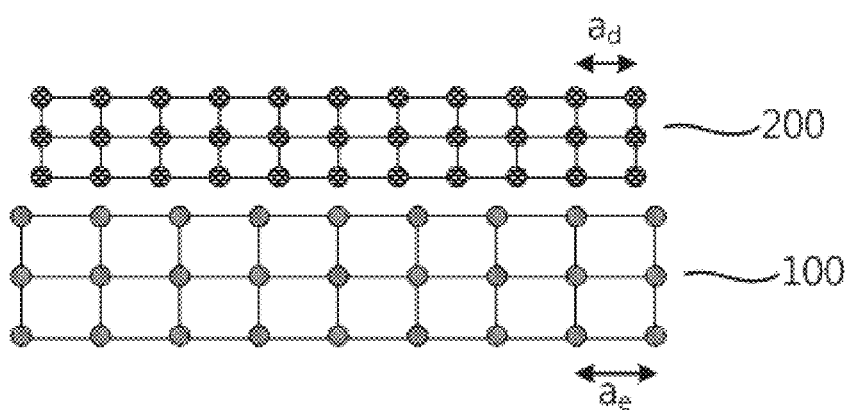

[FIG.2c]
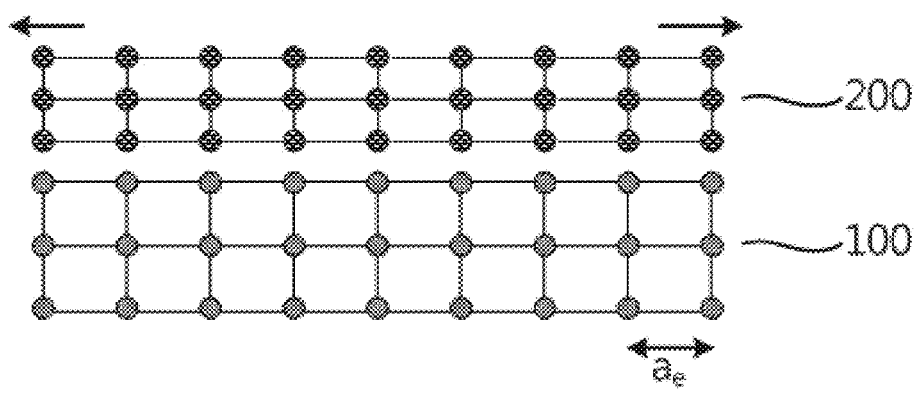

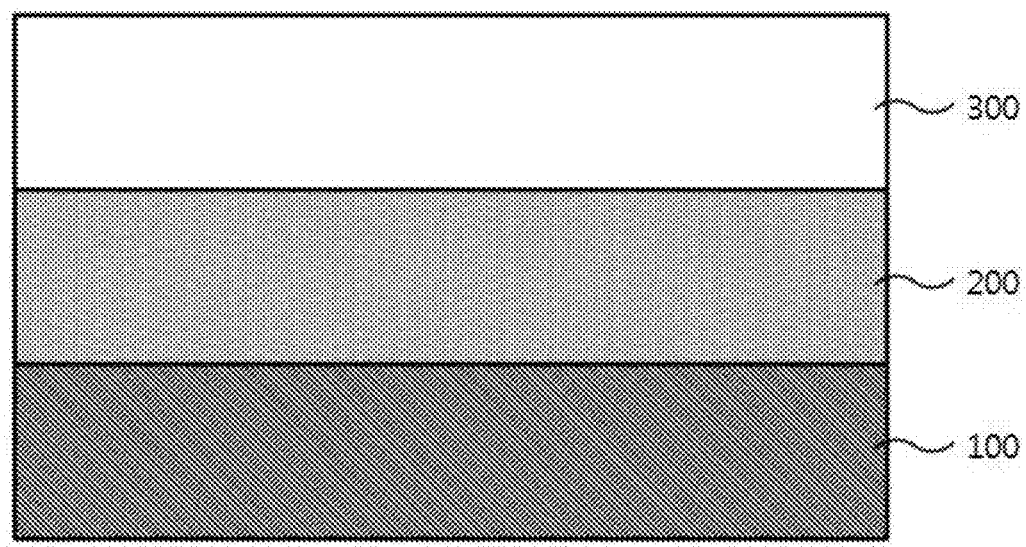
[FIG.3]

[FIG.4]
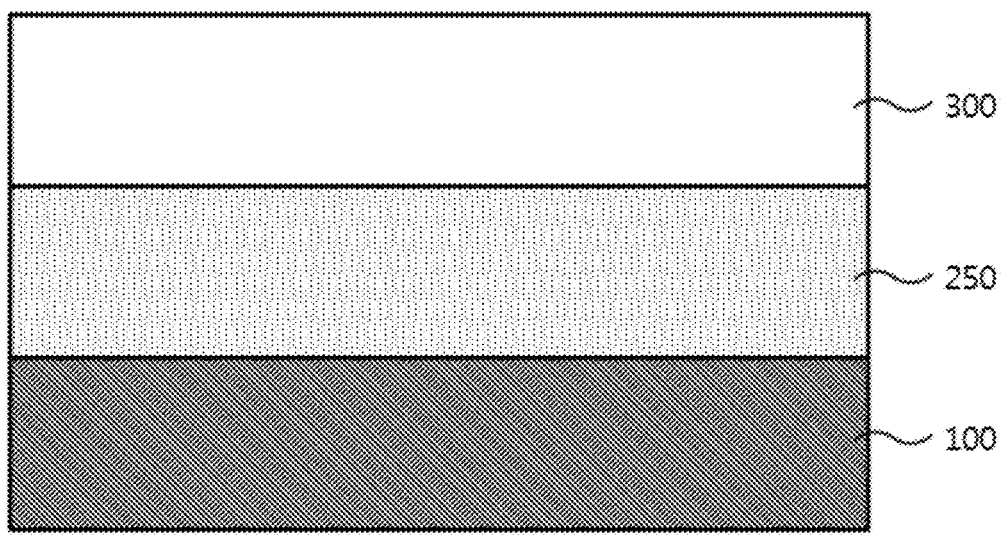

[FIG.5]
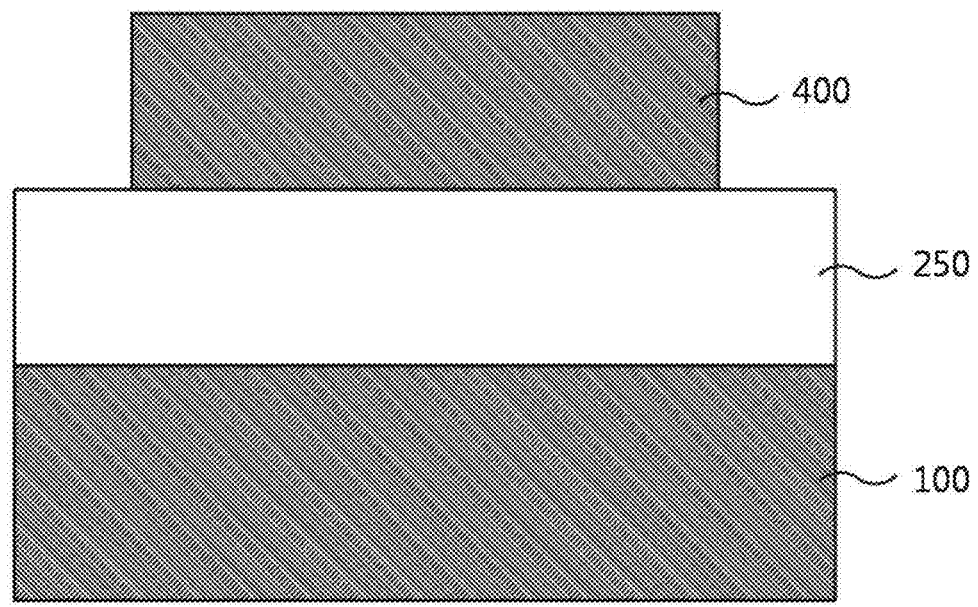

[FIG.8]
(a)
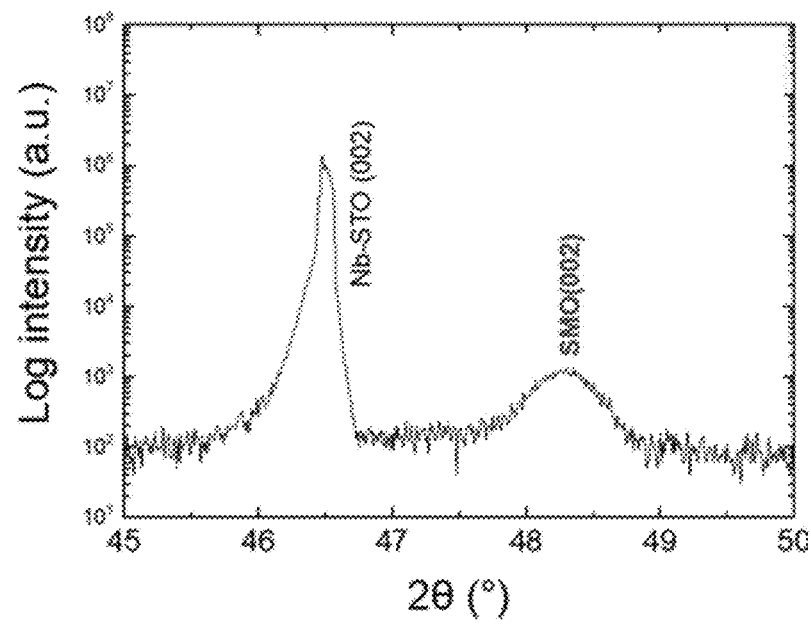
(b)
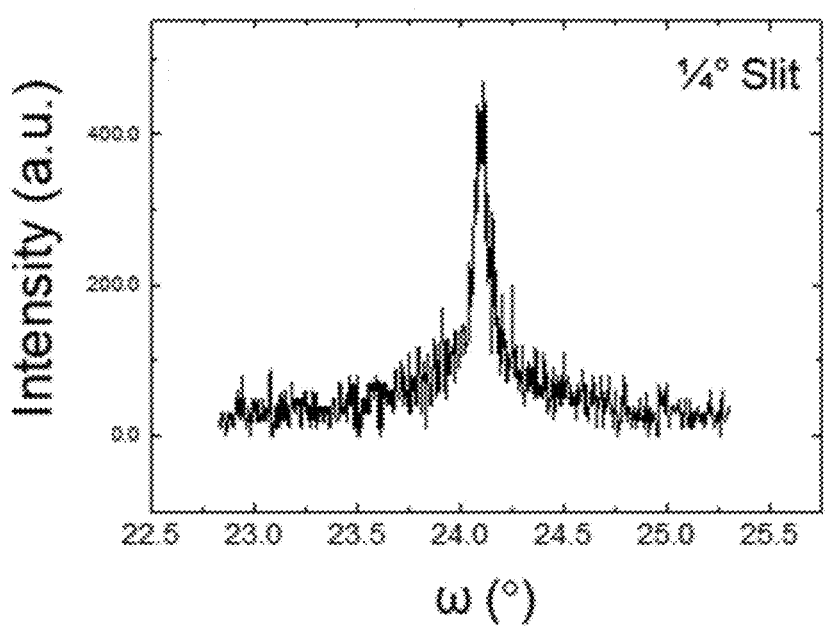

[FIG.9]
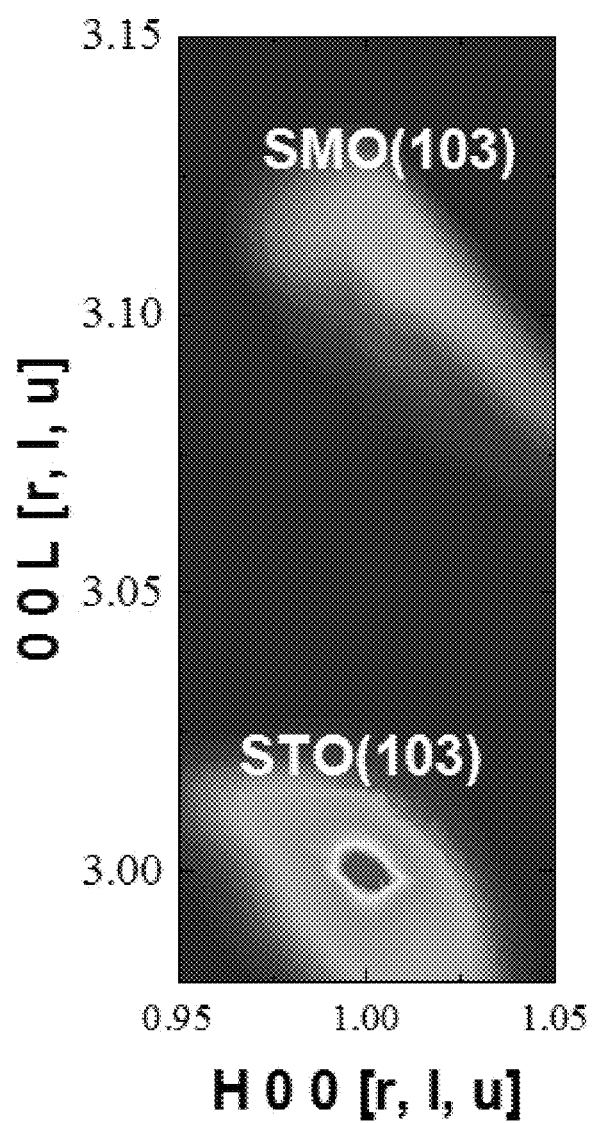

[FIG.10]
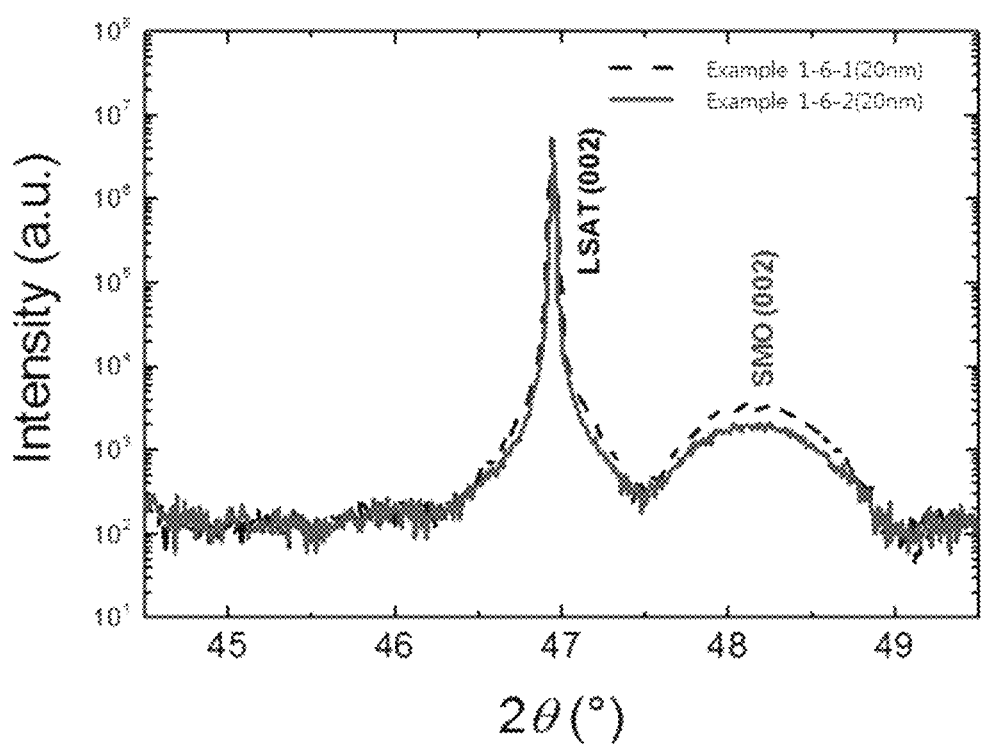

[FIG.11]
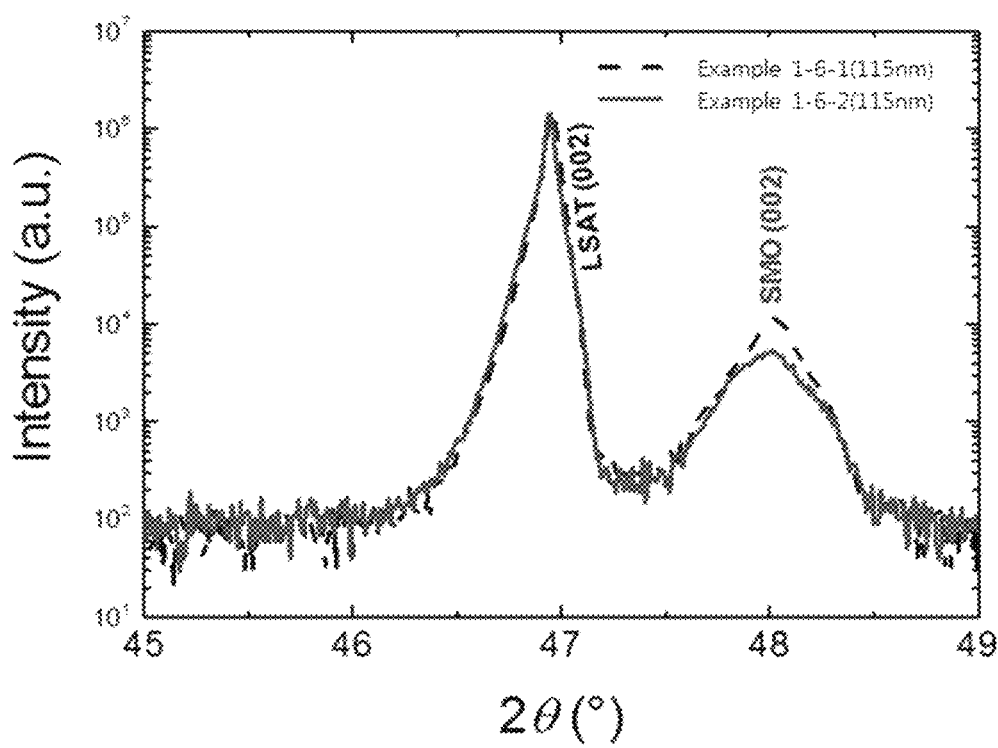

[FIG.12]
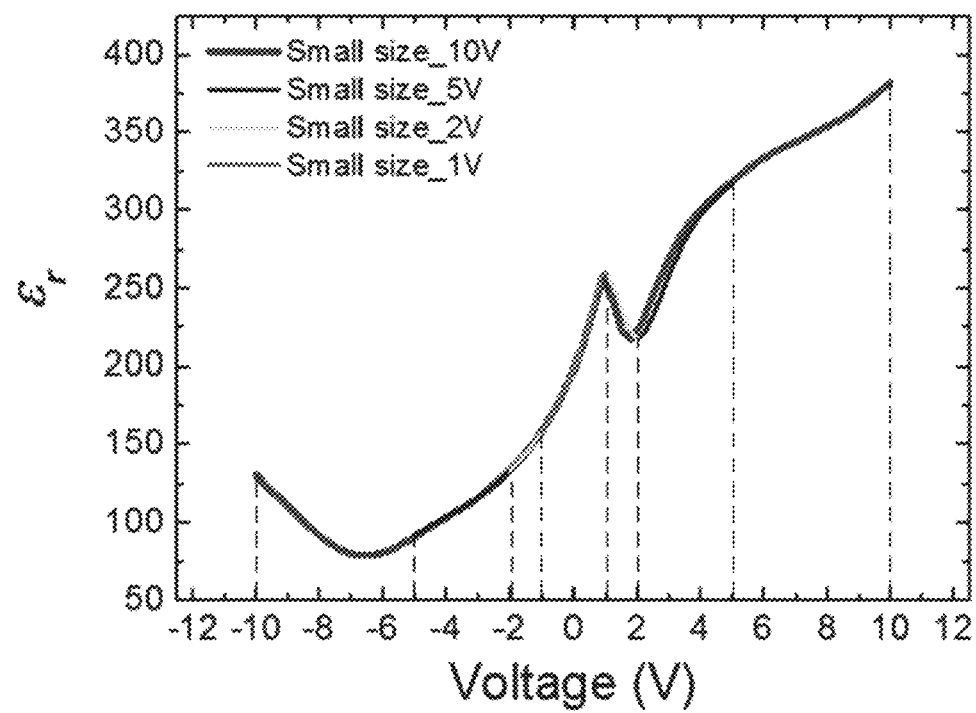

[FIG.13]
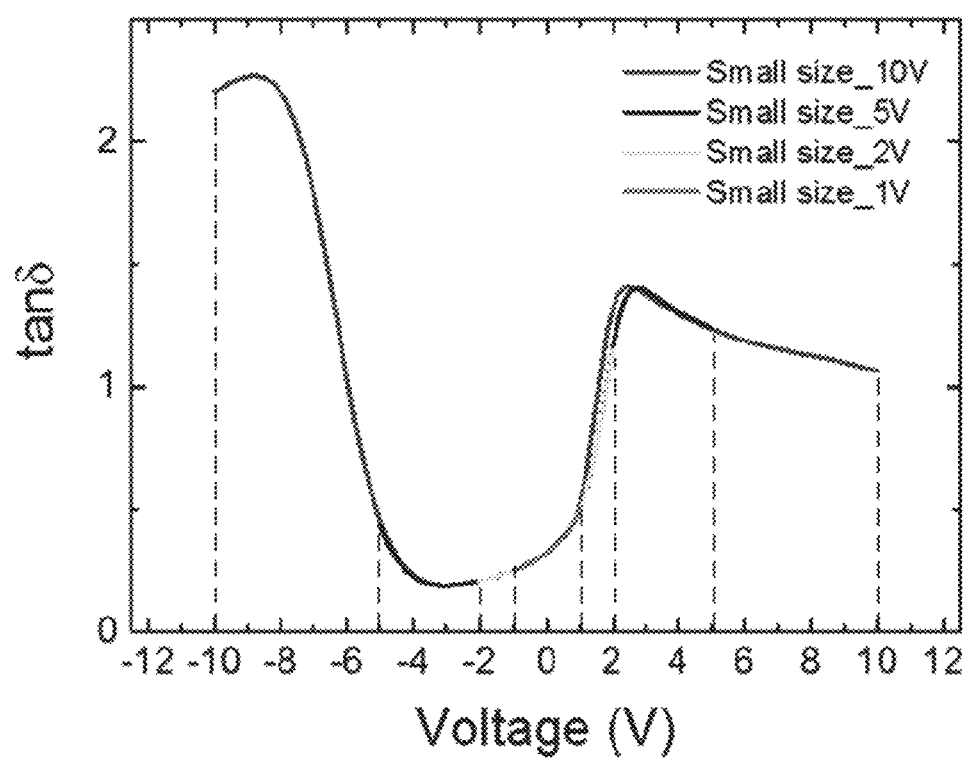

[FIG.14]
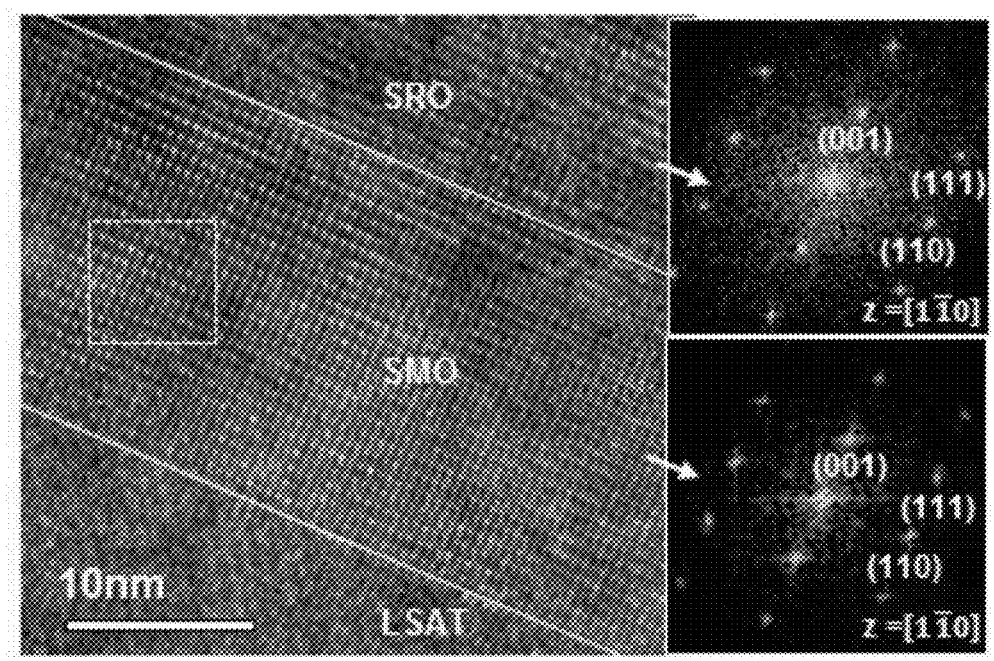

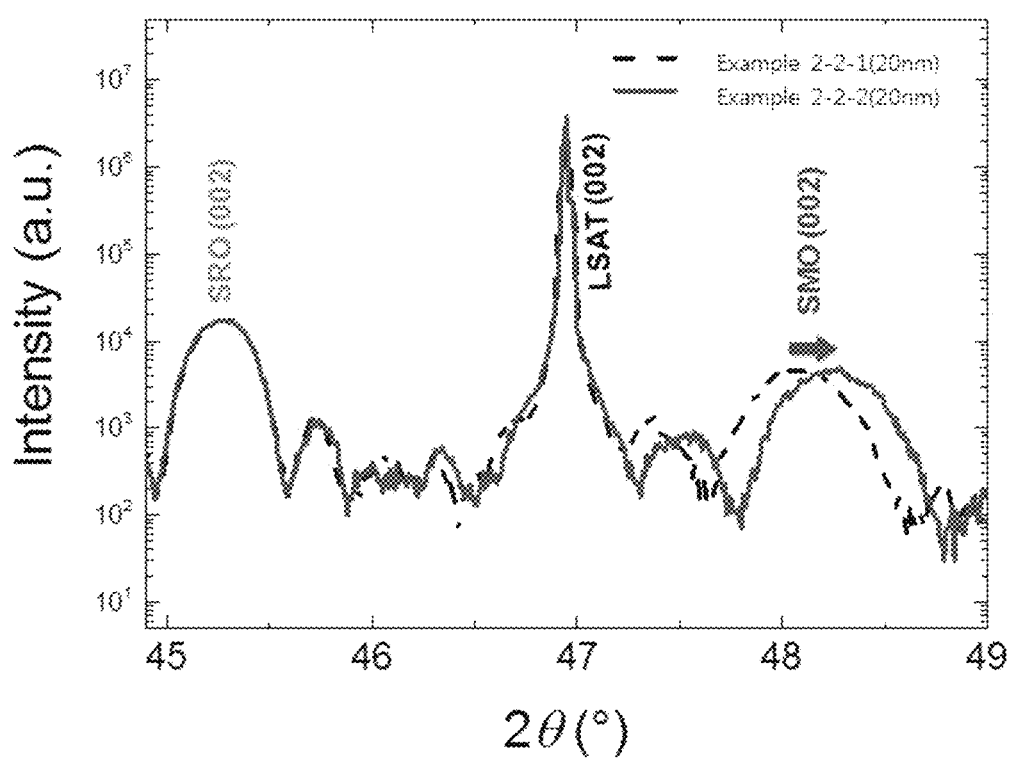

[FIG.17]
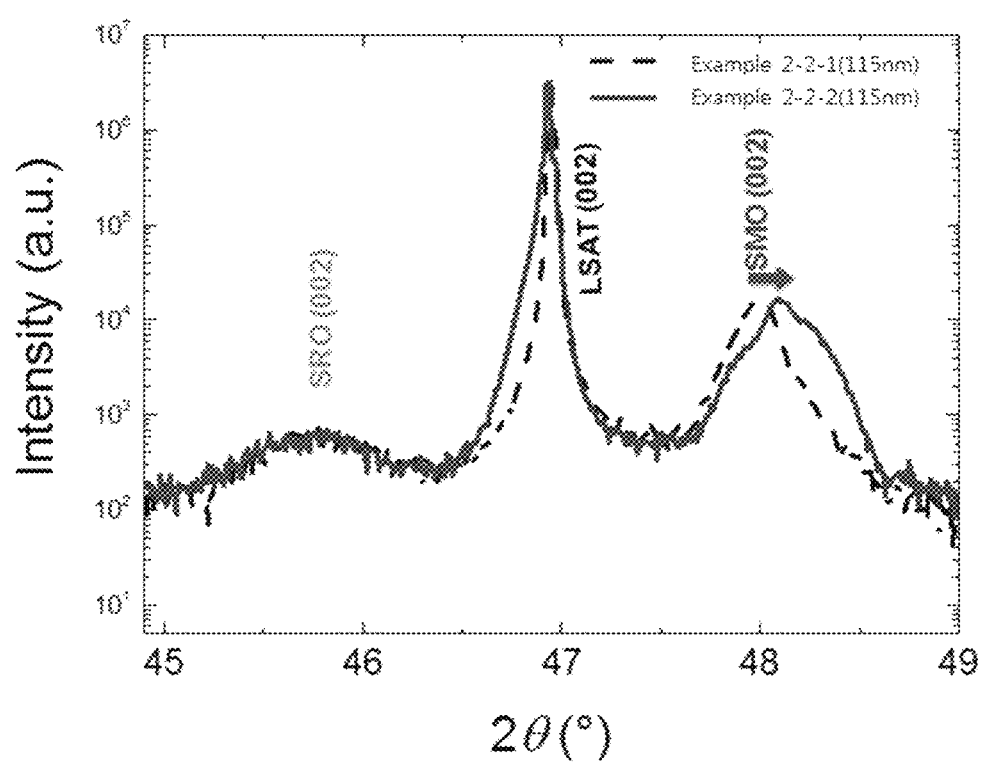

[FIG.18]
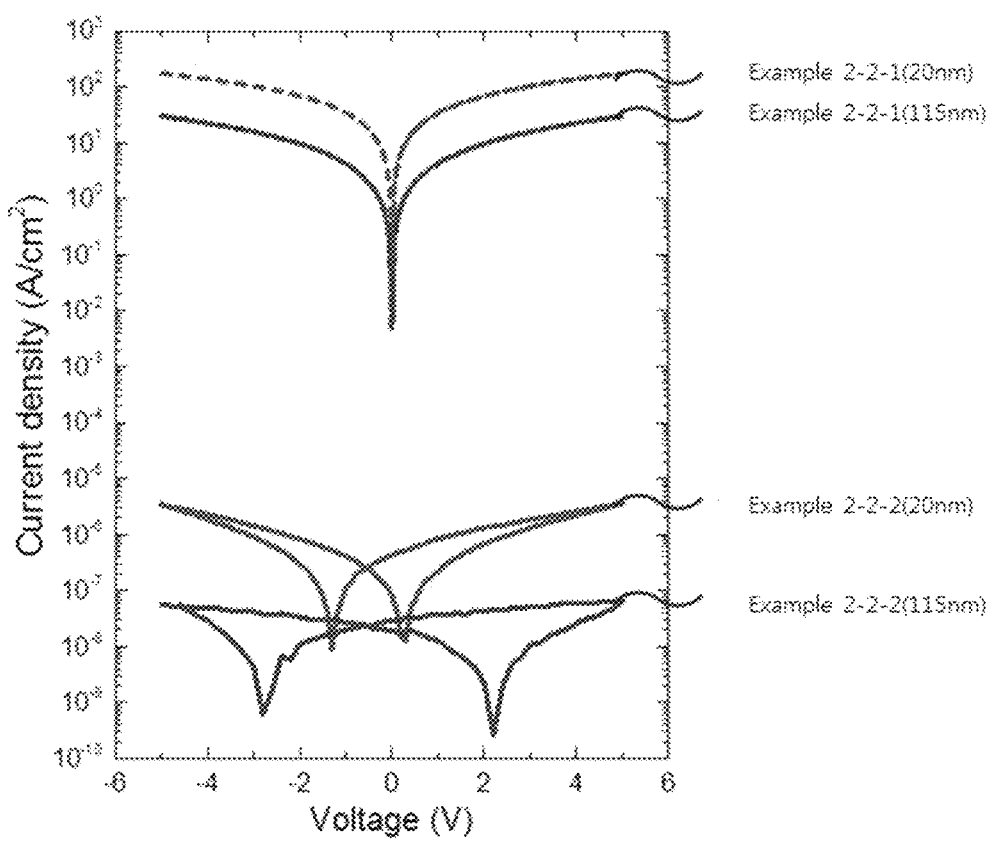

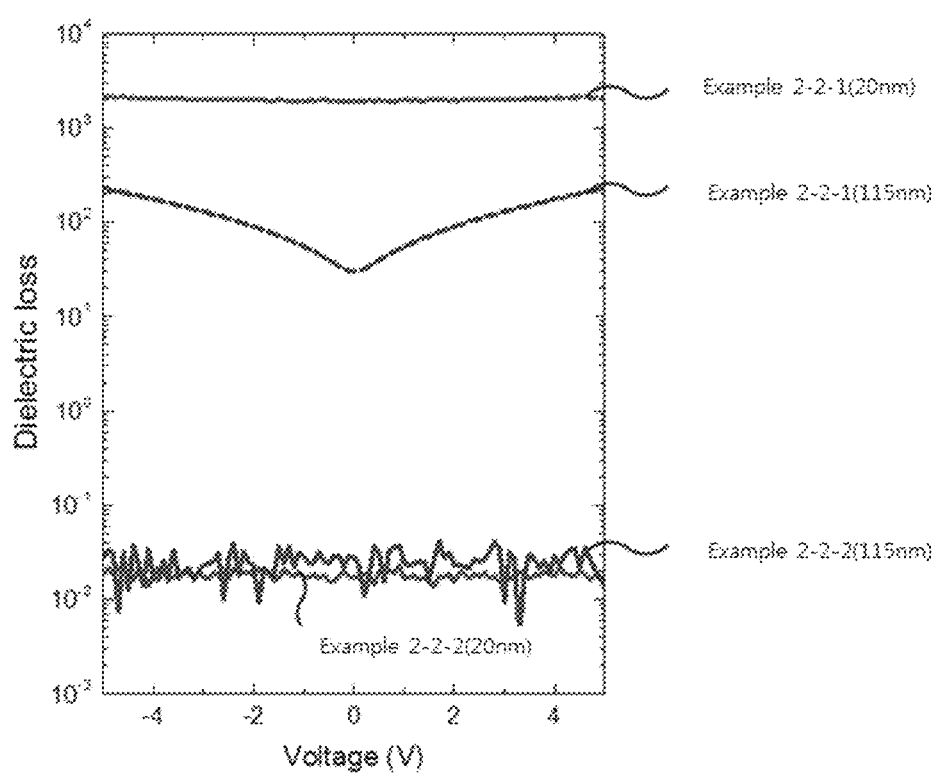
[FIG.19]

[FIG.20]
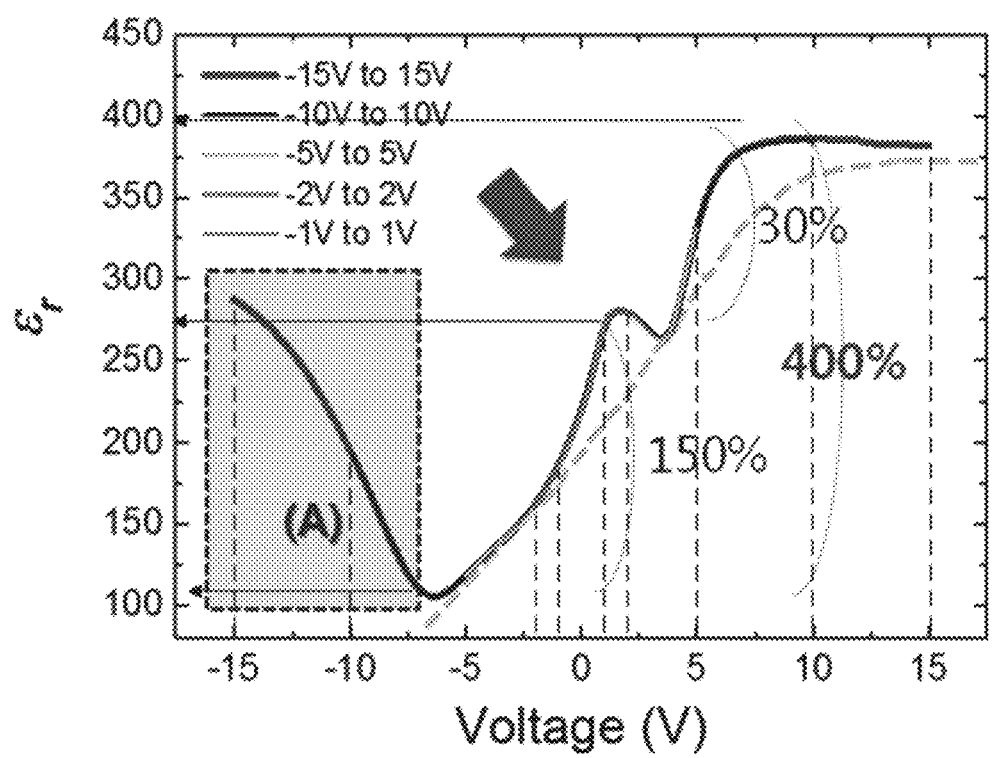

[FIG.21]
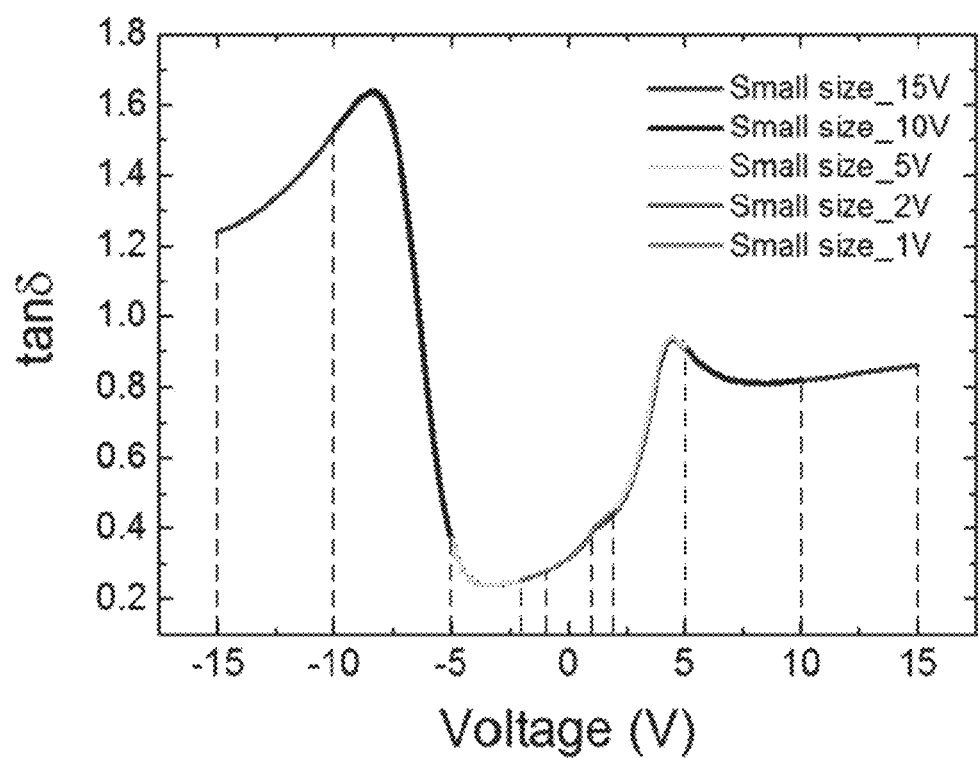

[FIG.22]
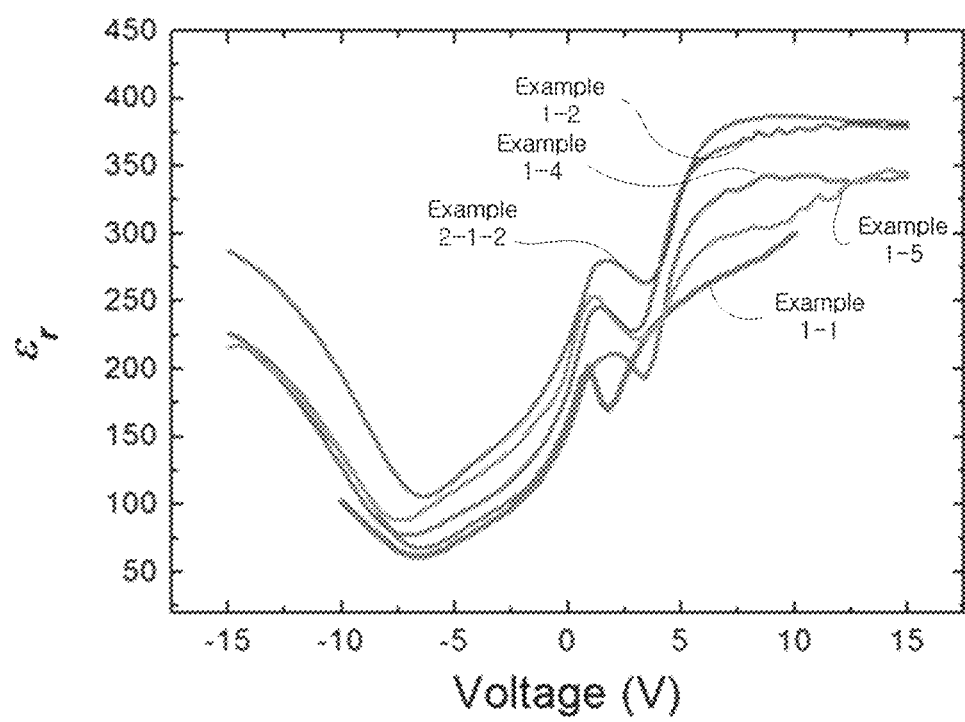

[FIG.23]
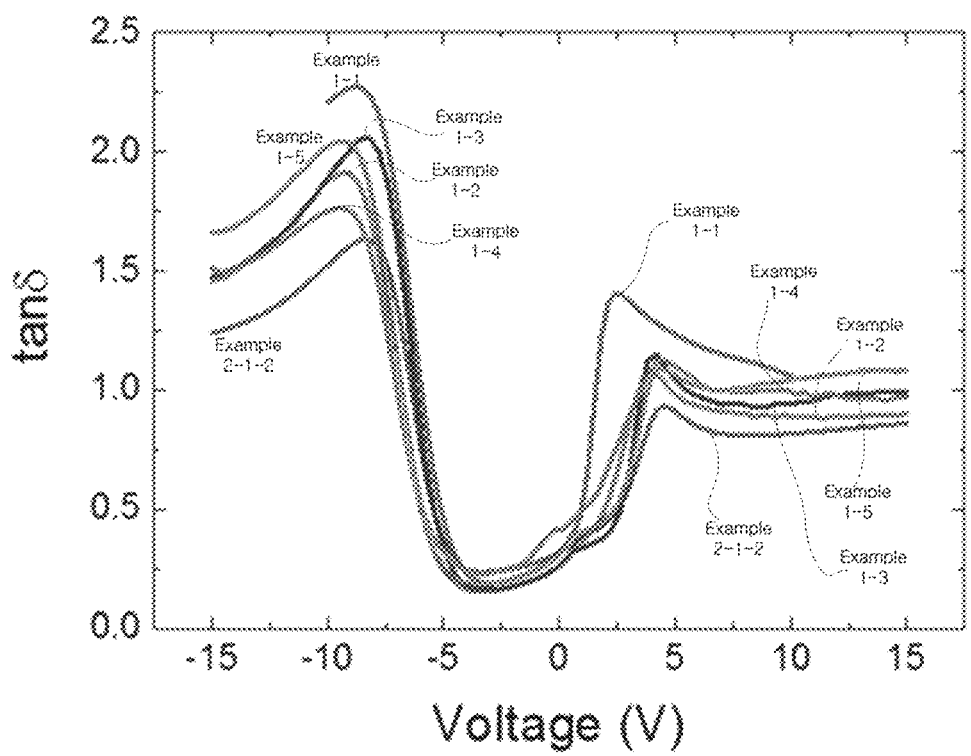

[FIG.24]
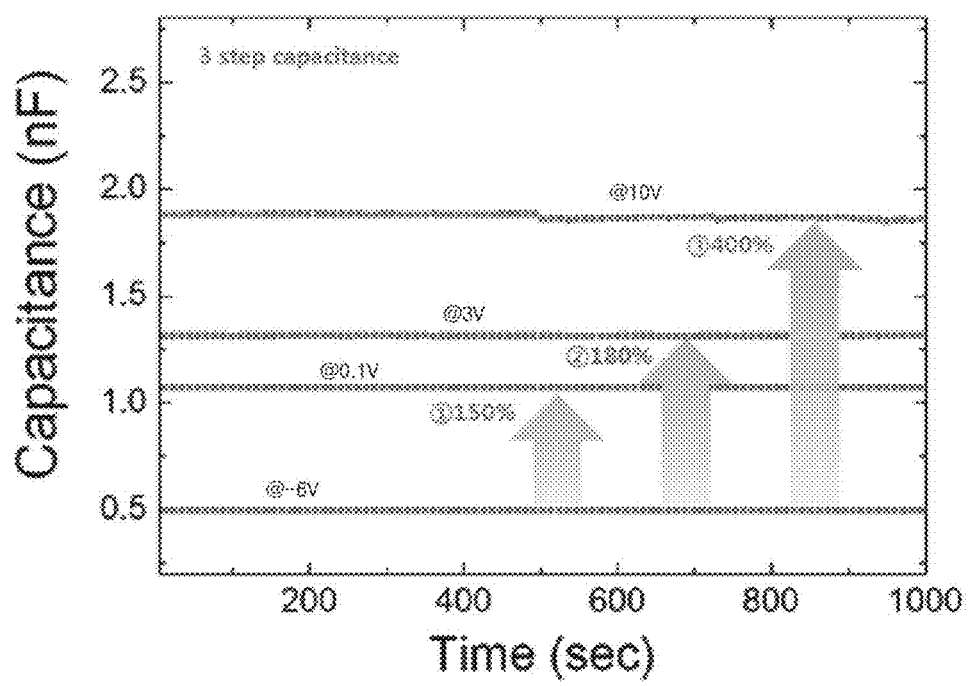

[FIG.25]
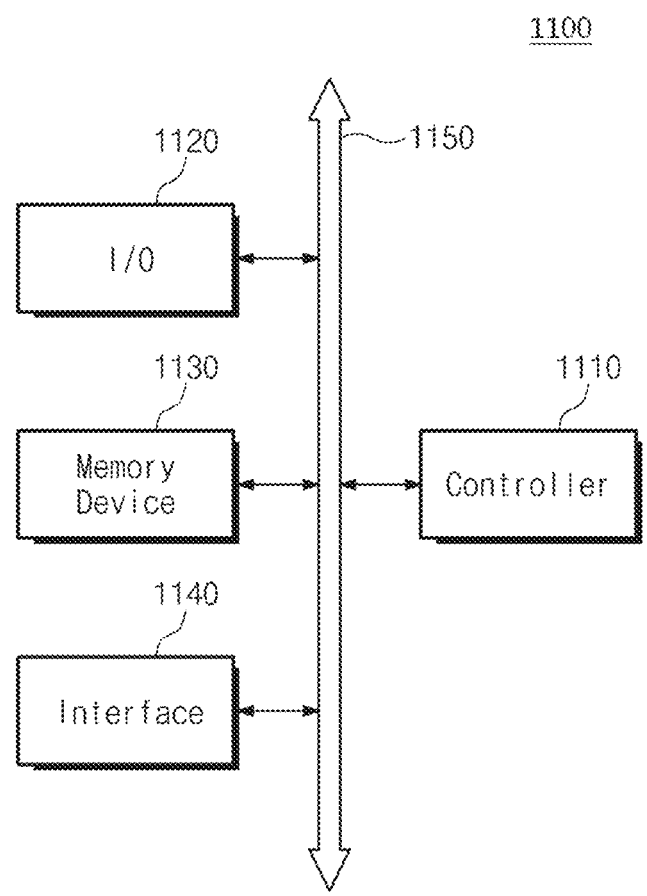

[FIG.26]
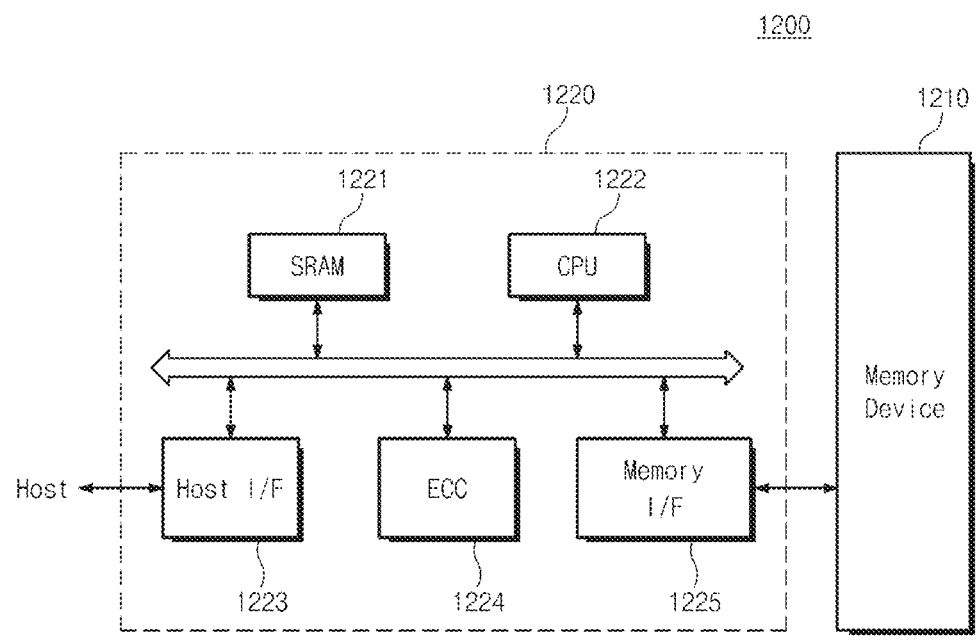

DIELECTRIC THIN FILM, MEMCAPACITOR INCLUDING THE SAME, CELL ARRAY INCLUDING THE SAME, AND MANUFACTURING METHOD THEREOF

CROSS-REFERENCE TO RELATED APPLICATIONS

This application claims the benefit of Republic of Korea Patent Application 10-2019-0146858 (filed 15 Nov. 2019), the entire disclosure of which is hereby incorporated by reference herein.

BACKGROUND OF THE INVENTION

1. Field of the Invention

The present application relates to a dielectric thin film, a memcapacitor including the same, a cell array including the same, and a manufacturing method thereof, and more particularly, to a dielectric thin film, a memcapacitor including the same, a cell array including the same, and a manufacturing method thereof, in which a preliminary dielectric thin film having an extended lattice constant is heat-treated in a gas atmosphere including a passivation element such that the passivation element may be provided in the preliminary dielectric thin film.

2. Description of the Prior Art

As the information and communication industry develops, development of highly integrated memory devices is required. In the case of a flash memory, which is a representative nonvolatile memory device, adjacent memory devices may interfere with each other when a circuit line width is reduced to about 40 nm or less, and thus an error may occur in stored data. In addition, due to the high integration, heat generation per unit area may be increased, so that an error may be increased in the memory device.

Therefore, researches have been increasingly conducted on a resistive random-access memory device having a simple structure in which a resistive switching layer is provided between an upper electrode and a lower electrode to allow a manufacturing process to be relatively simple, and having improved memory characteristics in comparison with a flash memory device having a floating gate and a control gate on a substrate and having a multilayer structure.

For example, Korean Patent Registration Publication No. 10-1742384 (Application No. 10-2015-0126064) discloses a resistive random-access memory device including: an inert electrode; a resistive switching layer disposed on the inert electrode and having a state change according to formation and extinction of a metal filament; and an active electrode disposed on the resistive switching layer, wherein the active electrode is formed of a $TaN_x$ material having an FCC structure where X is 0.9 to 1.1.

SUMMARY OF THE INVENTION

One technical object of the present disclosure is to provide a dielectric thin film having a variable dielectric property caused by an extended lattice constant, a memcapacitor including the same, a cell array including the same, and a manufacturing method thereof.

Another technical object of the present disclosure is to provide a dielectric thin film having a dielectric property improved by heat treatment in an oxygen atmosphere, a memcapacitor including the same, a cell array including the same, and a manufacturing method thereof.

The technical objects of the present disclosure are not limited to the above-described objects.

In order to achieve the technical objects, the present disclosure provides a memcapacitor.

In accordance with an aspect of the present disclosure, a memcapacitor includes: a first electrode having a metal-doped perovskite composition; a second electrode disposed on the first electrode; and a dielectric thin film having a perovskite composition, disposed between the first electrode and the second electrode, and having a variable dielectric constant depending on a voltage between the first electrode and the second electrode.

According to one embodiment, the metal doped into the first electrode may include at least one of niobium (Nb), silicon (Si), copper (Cu), aluminum (Al), molybdenum (Mo), tungsten (W), nickel (Ni), chromium (Cr), iron (Fe), gold (Au), silver (Ag), neodymium (Nd), or palladium (Pd).

According to one embodiment, the dielectric thin film may include a perovskite ($ABO_3$) including an A-site metal and a B-site metal, the A-site metal may include a rare earth metal, and the B-site metal may include a metal including a magnetic ion.

According to one embodiment, a lattice constant of the first electrode may be greater than a lattice constant of the dielectric thin film, and the dielectric thin film may be epitaxially grown on the first electrode and may receive a tensile force from the first electrode so that the dielectric thin film may have a lattice constant which is extended as compared with an intrinsic lattice constant thereof.

According to one embodiment, the first electrode may include Nb-doped $SrTiO_3$, and the dielectric thin film may include $SrMnO_3$.

According to one embodiment, the dielectric thin film may be provided on a (001) plane of the Nb-doped $SrTiO_3$.

In order to achieve the technical objects, the present disclosure provides a dielectric thin film.

In accordance with an aspect of the present disclosure, there is provided a dielectric thin film, in which the dielectric thin film has a lattice constant which is extended as compared with an intrinsic lattice constant thereof, the dielectric thin film includes a passivation element that reduces a dielectric loss increased due to the extension of the lattice constant, and the dielectric thin film has a variable dielectric constant due to an electric field applied from an outside.

According to one embodiment, the passivation element may passivate a vacancy created due to the extension of the lattice constant.

According to one embodiment, a vacancy created due to the extension of the lattice constant may include an oxygen vacancy, and the passivation element may include oxygen.

According to one embodiment, a (002) peak may be observed when a value of 2θ exceeds 48° through XRD measurement.

In order to achieve the technical objects, the present disclosure provides a memcapacitor.

In accordance with an aspect of the present disclosure, a memcapacitor includes: a first electrode; the dielectric thin film disposed on the first electrode; and a second electrode disposed on the dielectric thin film, wherein the first electrode makes direct contact with the dielectric thin film to apply a tensile force to the dielectric thin film so that the dielectric thin film has a lattice constant which is extended as compared with an intrinsic lattice constant thereof.

In order to achieve the technical objects, the present disclosure provides a method of manufacturing a dielectric thin film.

In accordance with an aspect of the present disclosure, a method of manufacturing a dielectric thin film includes: preparing a preliminary dielectric thin film having a lattice constant which is extended as compared with an intrinsic lattice constant thereof, and having a dielectric loss which is increased due to the extension of the lattice constant; forming a protective layer on the preliminary dielectric thin film; and forming a dielectric thin film in which a passivation element is provided in the preliminary dielectric thin film, by heat-treating the preliminary dielectric thin film and the protective layer in a gas atmosphere including the passivation element.

According to one embodiment, the passivation element may reduce a dielectric loss due to the extension of the lattice constant so that the dielectric thin film may have a dielectric loss lower than the dielectric loss of the preliminary dielectric thin film.

According to one embodiment, the method may further include removing the protective layer after the heat-treating of the preliminary dielectric film and the protective layer.

According to one embodiment, the preparing of the preliminary dielectric thin film may include: preparing a first electrode having a lattice constant greater than the lattice constant of the preliminary dielectric thin film; and preparing the preliminary dielectric thin film having the lattice constant which is extended as compared with the intrinsic lattice constant thereof by epitaxially growing the preliminary dielectric thin film on the first electrode.

According to one embodiment, the preliminary dielectric thin film and the protective layer may be formed by a pulse laser deposition scheme.

In order to achieve the technical objects, the present disclosure provides a method of manufacturing a memcapacitor.

In accordance with an aspect of the present disclosure, a method of manufacturing a memcapacitor includes: forming the dielectric thin film on the first electrode; removing the protective layer; and forming a second electrode on the dielectric thin film.

According to an embodiment of the present invention, the method of manufacturing the dielectric thin film includes: preparing a preliminary dielectric thin film having a lattice constant which is extended as compared with an intrinsic lattice constant thereof, and having a dielectric loss which is increased due to the extension of the lattice constant; forming a protective layer on the preliminary dielectric thin film; and forming a dielectric thin film in which a passivation element is provided in the preliminary dielectric thin film, by heat-treating the preliminary dielectric thin film and the protective layer in a gas atmosphere including the passivation element.

The preparing of the preliminary dielectric thin film may include preparing the preliminary dielectric thin film by epitaxially growing the preliminary dielectric thin film on the first electrode having a lattice constant greater than the intrinsic lattice constant of the preliminary dielectric thin film. In other words, the preliminary dielectric thin film may be prepared on the first electrode having the lattice constant greater than the lattice constant of the preliminary dielectric thin film, so that the preliminary dielectric thin film having the extended lattice constant can be formed. In this case, the preliminary dielectric thin film may be formed therein with the vacancy due to extension of a lattice.

After the forming of the protective layer, the heat-treating of the preliminary dielectric thin film and the protective layer in the gas atmosphere including the passivation element may include passivating the vacancy, which is created due to the extension of the lattice of the preliminary dielectric thin film, with the passivation element. In other words, the dielectric loss of the preliminary dielectric thin film may be increased due to the vacancy created due to the extension of the lattice, and the passivation element may be provided to the dielectric thin film of which the dielectric loss is increased, so that the dielectric thin film with a reduced dielectric loss can be formed.

Accordingly, the dielectric thin film may have a variable dielectric constant due to a phase change caused by the applied electric field. Therefore, after the removing of the protective layer, the second electrode may be formed on the dielectric thin film, so that a multilevel memcapacitor can be manufactured. In other words, a memcapacitor including the dielectric thin film having the variable dielectric constant can be manufactured.

BRIEF DESCRIPTION OF THE DRAWINGS

FIG. 1 is a flowchart for describing a method of manufacturing a dielectric thin film according to an embodiment of the present invention.

FIGS. 2a through 2c are views for describing the method of manufacturing the dielectric thin film according to the embodiment of the present invention.

FIGS. 3 and 4 are views for describing the method of manufacturing the dielectric thin film according to the embodiment of the present invention.

FIG. 5 is a schematic view illustrating a memcapacitor according to an embodiment of the present invention.

FIG. 8 is a view illustrating the XRD pattern of the dielectric thin film according to Example 1-1 of the present invention.

FIG. 9 is a view illustrating a reciprocal space map (RSM) result of the dielectric thin film according to Example 1-1 of the present invention.

FIGS. 10 and 11 are views illustrating XRD patterns according to thicknesses of dielectric thin films according to Examples 1-6-1 and 1-6-2 of the present invention.

FIGS. 12 and 13 are views illustrating dielectric constants and loss tangents (tangent delta) according to voltages applied to the dielectric thin film according to Example 1-1 of the present invention.

FIGS. 14 and 15 are views illustrating a TEM image, a Fourier transform pattern of the TEM image, and an annular bright-field image of a dielectric thin film according to Example 2-2-2 of the present invention.

FIGS. 16 and 17 are views illustrating XRD patterns according to thicknesses of dielectric thin films according to Examples 2-1-1 and 2-2-2 of the present invention.

FIG. 18 is a view illustrating a voltage versus a current density according to thicknesses of dielectric thin films according to Examples 2-2-1 and 2-2-2 of the present invention.

FIG. 19 is a view illustrating a voltage versus a dielectric loss according to the thicknesses of the dielectric thin films according to Examples 2-2-1 and 2-2-2 of the present invention.

FIGS. 20 and 21 are views illustrating a dielectric constant and a loss tangent according to a voltage of a dielectric thin film according to Example 2-1-2 of the present invention.

FIGS. 22 and 23 are views illustrating dielectric constants and loss tangents according to voltages of the dielectric thin films according to Examples 1-1 to 1-5 and Example 2-1-2 of the present invention.

FIG. 24 is a view illustrating a dielectric constant according to a time of the dielectric thin film according to Example 2-1-2 of the present invention.

FIG. 25 is a block diagram schematically illustrating one example of an electronic system including a memcapacitor based on the technical idea of the present invention.

FIG. 26 is a block diagram schematically illustrating one example of a memory card including the memcapacitor based on the technical idea of the present invention.

DETAILED DESCRIPTION OF THE EXEMPLARY EMBODIMENTS

Figure 6:
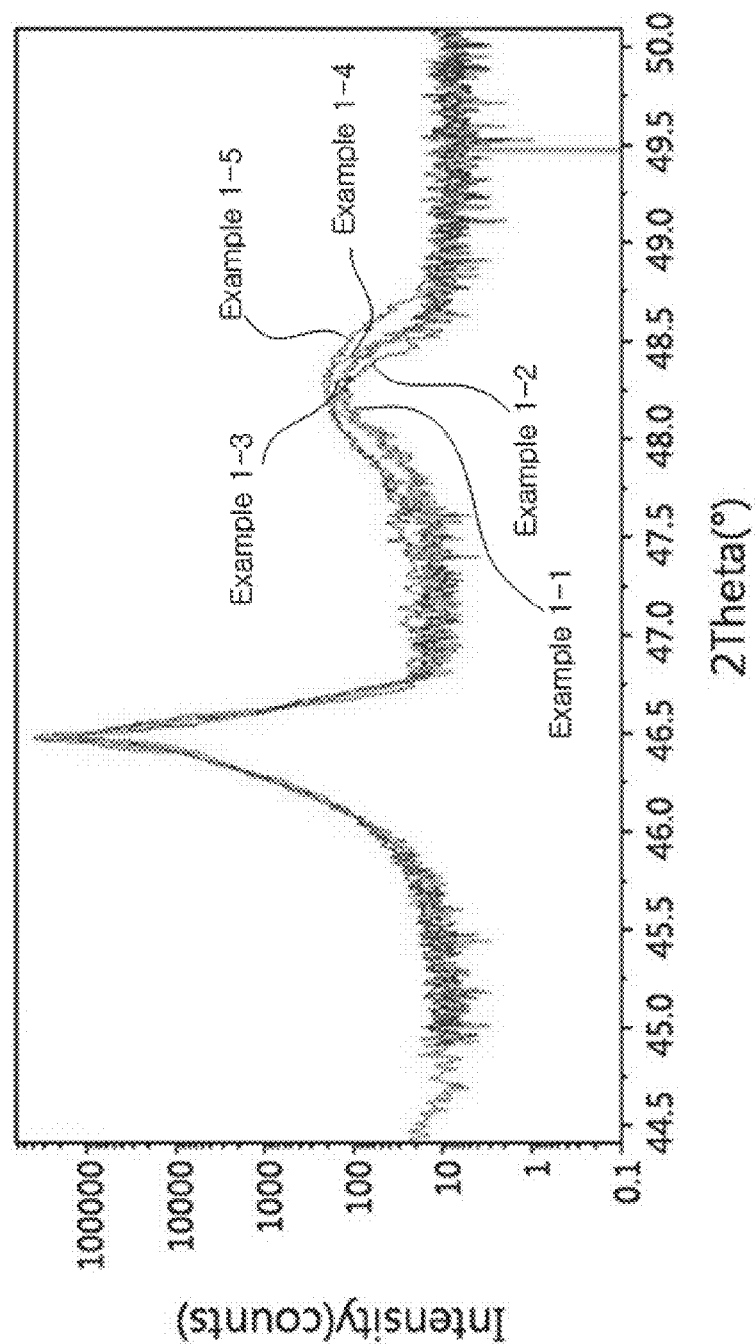
FIG. 6 is a view illustrating X-ray diffraction (XRD) patterns of dielectric thin films according to Examples 1-1 to 1-5 of the present invention.

Hereinafter, exemplary embodiments of the present invention will be described in detail with reference to the accompanying drawings. However, the technical idea of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that a first element may be directly formed on a second element, or a third element may be interposed between the first element and the second element. Further, in the drawings, thicknesses of membranes and areas are exaggerated for efficient description of the technical contents.

In addition, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments described and illustrated herein include their complementary embodiments. Further, the term "and/or" in the specification is used to include at least one of the elements enumerated before and after the term.

In the specification, the terms of a singular form may include plural forms unless the context clearly indicates otherwise. Further, the terms such as "including" and "having" are used to designate the presence of features, numbers, steps, elements, or combinations thereof described in the specification, and shall not be construed to preclude any possibility of presence or addition of one or more other features, numbers, steps, elements, or combinations thereof.

Further, in the following description of the present invention, a detailed description of known functions and configu-rations incorporated herein will be omitted when it may make the subject matter of the present invention unnecessarily unclear.

FIG. 1 is a flowchart for describing a method of manufacturing a dielectric thin film according to an embodiment of the present invention, and FIGS. 2 to 4 are views for describing the method of manufacturing the dielectric thin film according to the embodiment of the present invention.

Referring to FIGS. 1 and 2, a preliminary dielectric thin film 200 having a lattice constant which is extended as compared with an intrinsic lattice constant (ad) thereof and having a dielectric loss increased due to the extension of the lattice constant may be prepared (S110).

According to one embodiment, the preliminary dielectric thin film 200 may be prepared by epitaxially growing the preliminary dielectric thin film 200 on a first electrode 100. For example, the preliminary dielectric thin film 200 may be epitaxially formed on the first electrode 100 by various schemes such as a pulse laser deposition scheme and a sputter scheme.

According to one embodiment, the preliminary dielectric thin film 200 may be prepared on the first electrode 100 by the pulse laser deposition scheme. In detail, the first electrode 100 may be disposed in a substrate holder in a chamber, and a vacuum may be formed in the chamber. The substrate holder in the chamber in which the vacuum is formed may be heated, and an oxygen gas may be provided in the chamber. When a temperature of the substrate holder reaches a temperature for deposition, a laser pulse may be provided to a target of the preliminary dielectric thin film 200. Accordingly, the preliminary dielectric thin film 200 may be prepared on the first electrode 100.

According to one embodiment, the preliminary dielectric thin film 200 may include a perovskite denoted as $ABO_3$. In detail, the preliminary dielectric thin film 200 according to the embodiment of the present invention may have antiferromagnetic-paraelectric in bulk, and lattice deformation may involve deformation of an electric or magnetic field. Accordingly, an A-site metal of the preliminary dielectric thin film 200 may include a rare earth metal, and a B-site metal may include a material including a magnetic ion.

For example, the A-site metal may include one of scandium (Sc), yttrium (Y), lanthanum (La), cerium (Ce), praseodymium (Pr), neodium (Nd), promethium (Pm), samarium (Sm), europium (Eu), gadolinium (Gd), tellurium (Tb), dysprosium (Dy), holmium (Ho), erbium (Er), tolium (Tm), ytterbium (Yb), or lutetium (Lu).

In addition, for example, the B-site metal may include a transition metal which is one of iron (Fe), cobalt (Co), nickel (Ni), or manganese (Mn).

As another example, the B-site metal may include a metalloid which is one of boron (B), carbon (C), silicon (Si), or aluminum (Al).

As still another example, the B-site metal may include a rare-earth magnetic metal which is one of cerium (Ce), praseodymium (Pr), neodium (Nd), promethium (Pm), samarium (Sm), europium (Eu), gadolinium (Gd), telbium (Tb), dysprosium (Dy), holmium (Ho), erbium (Er), tolium (Tm), ytterbium (Yb), or lutetium (Lu).

In detail, for example, the preliminary dielectric thin film 200 may include strontium manganite ($SrMnO_x$).

According to one embodiment, the first electrode 100 may include a metal-doped metal oxide.

For example, the metal may include at least one of niobium (Nb), silicon (Si), copper (Cu), aluminum (Al), molybdenum (Mo), tungsten (W), nickel (Ni), chromium (Cr), iron (Fe), gold (Au), silver (Ag), neodymium (Nd), or palladium (Pd).

In addition, for example, the metal oxide may include at least one of aluminum oxide ($Al_2O_3$), zinc oxide (ZnO), magnesium oxide (MgO), strontium titanate ($SrTiO_3$), yttria stabilized zirconia (YSZ), lanthanum aluminate ($LaAlO_x$), yttrium aluminum garnet (YAG), or niobium gallium oxide ($NdGaO_3$).

In detail, for example, the first electrode 100 may include strontium titanate ($SrTiO_3$) doped with niobium.

As described above, for example, the first electrode 100 may include the niobium-doped strontium titanate (Nb—$SrTiO_3$) having a (001) plane, and a target of the preliminary dielectric thin film 200 may be strontium manganate ($SrMnO_3$). In this case, after the first electrode 100 is disposed in the chamber and a vacuum is formed in the chamber, the substrate holder may be heated to a temperature of 900° C., and the oxygen gas may be provided into the chamber at a partial pressure of 200 mTorr. When the temperature of the substrate holder reaches 900° C., a laser pulse of 10 Hz and 1800 pulses is provided to the strontium manganate target, so that a thin film of strontium manganite ($SrMnO_x$) may be prepared on the (001) plane of the niobium-doped strontium titanate (Nb—$SrTiO_3$).

As described above, the preliminary dielectric thin film 200 may be formed on the first electrode 100. In this case, the preliminary dielectric thin film 200 may have an intrinsic lattice constant $a_d$ smaller than a lattice constant $a_e$ of the first electrode 100. Accordingly, the preliminary dielectric thin film 200 epitaxially grown on the first electrode 100 may have a lattice constant which is extended as compared with the intrinsic lattice constant $a_d$ of the preliminary dielectric thin film 200, and simultaneously, the preliminary dielectric thin film 200 may have a vacancy created in an extended lattice. In detail, for example, the vacancy in the preliminary dielectric thin film 200 may include an oxygen vacancy.

According to one embodiment, as described above, the preliminary dielectric thin film 200 may have the extended lattice constant. Generally, when the lattice of the preliminary dielectric thin film 200 including strontium manganite is provided with a tensile force of 2%, G-type antiferromagnetic-weak ferromagnetic and C-type antiferromagnetic-ferromagnetic may be easily interchanged. Accordingly, the perovskite may have a variable dielectric constant due to an electric field applied from an outside. In other words, the preliminary dielectric thin film 200 prepared according to the embodiment of the present invention may have the variable dielectric constant.

Referring to FIGS. 1 and 3, a protective layer 300 may be formed on the preliminary dielectric thin film 200 (S120).

According to one embodiment, the protective layer 300 may be formed on the preliminary dielectric thin film 200 by the pulse laser deposition scheme. In other words, the preliminary dielectric thin film 200 and the protective layer 300 may be prepared by the pulse laser deposition scheme. Accordingly, immediately after the preliminary dielectric thin film 200 is prepared, the protective layer 300 may be formed on the preliminary dielectric thin film 200.

Therefore, as described above, the first electrode 100 and the target of the preliminary dielectric thin film 200 may be inserted into the chamber. In this case, a target of the protective layer 300 may also be disposed in the chamber. For example, the protective layer 300 may be strontium ruthenate ($SrRuO_3$).

In detail, for example, immediately after the preliminary dielectric thin film 200 is prepared on the first electrode 100 in the chamber, the temperature of the substrate holder may be reduced to 750° C., and simultaneously, the partial pressure of the oxygen gas may be changed to 100 mTorr. When the temperature of the substrate holder reaches 750° C., a laser pulse of 3 Hz and 1820 pulses may be provided to the target of the protective layer 300. Accordingly, the protective layer 300 may be prepared on the preliminary dielectric thin film 200.

According to one embodiment, the protective layer 300 may have the same crystal structure as the preliminary dielectric thin film 200 with a lattice constant greater than the intrinsic lattice constant of the preliminary dielectric thin film 200. Accordingly, the preliminary dielectric thin film 200 may be formed at upper and lower portions thereof with thin films having lattice constants greater than the inherent lattice constant of the preliminary dielectric thin film 200. In detail, for example, when the protective layer 300 is strontium ruthenate, and the preliminary dielectric thin film 200 is strontium manganate, the protective layer 300 and the preliminary dielectric thin film 200 may have a cubic perovskite structure and a lattice misfit of 3.29%.

Referring to FIGS. 1 and 4, a dielectric thin film 250 in which a passivation element is provided in the preliminary dielectric thin film 200 may be formed by heat-treating the preliminary dielectric thin film 200 and the protective layer 300 in a gas atmosphere including the passivation element (S130).

According to one embodiment, the first electrode 100 on which the preliminary dielectric thin film 200 and the protective layer 300 are sequentially stacked may be heat-treated under a passivation element atmosphere. Accordingly, the passivation element may be provided to the vacancy of the preliminary dielectric thin film 200, so that the dielectric thin film 250 may be manufactured. For example, the passivation element may include an oxygen element.

In detail, for example, the first dielectric layer 200 on which the preliminary dielectric thin film 200 and the protective layer 300 are sequentially stacked may be provided in a furnace. The oxygen gas may be provided in the furnace at a rate of 2 L/min, and the heat treatment may be performed at a temperature of 600° C. for 2 hours, so that the dielectric thin film 250 provided with the oxygen element of the oxygen gas may be manufactured.

As described above, the vacancy in the preliminary dielectric thin film 200 may be passivated. Accordingly, the dielectric thin film 250 from which a defect formed in the preliminary dielectric thin film 200 due to the lattice misfit between the first electrode 100 and the protective layer 300 is removed may be formed.

In addition, the passivation element may be provided, an oxidation number of a B-site metal ion in the preliminary dielectric thin film 200 may be increased, and simultaneously, an ionic radius of the B-site metal ion may be reduced. Accordingly, a volume of the preliminary dielectric thin film 200 may be reduced. Therefore, a c-lattice constant of the preliminary dielectric thin film 200 which is perpendicular to a surface of the first electrode 100 may be contracted, while a lattice of a surface epitaxially grown on the surface of the first electrode 100 may not be substantially contracted or extended.

In other words, the dielectric thin film 250 in which the passivation element is provided and the c-lattice of the preliminary dielectric thin film 200 is contracted may be manufactured. In addition, the vacancy may be passivated, and the dielectric thin film 250 may have a reduced dielectric loss as compared with the preliminary dielectric thin film 200. In detail, for example, when the preliminary dielectric thin film 200 is strontium manganate ($SrMnO_x$), the preliminary dielectric thin film 200 may include both manganese trivalent ions ($Mn^{3+}$) and manganese tetravalent ions ($Mn^{4+}$). However, as described above, the passivation element may be provided, and the manganese trivalent ions ($Mn^{3+}$) in the preliminary dielectric thin film 200 may be changed to the manganese tetravalent ions ($Mn^{4+}$). Accordingly, the manufactured dielectric thin film 250 may substantially include only the manganese tetravalent ions ($Mn^{4+}$).

According to the embodiment of the present invention, it may be understood that a 2θ value at which a (002) peak is observed in an X-ray diffraction pattern is increased in the dielectric film 250 compared to the preliminary dielectric film 200. In detail, for example, the preliminary dielectric thin film 200 may have a (002) peak at about 48°, and the dielectric thin film 250 may have a (002) peak at about 48.3°.

According to one embodiment, as described above, the preliminary dielectric thin film 200 may have a variable dielectric constant, and thus the dielectric thin film 250 may also have a variable dielectric constant. However, the dielectric thin film 250 may have less vacancy in the lattice as compared with the preliminary dielectric thin film 200. Therefore, variation of the dielectric constant of the dielectric thin film 250 may be stabilized as compared with the preliminary dielectric thin film 200. In other words, a range of modulation values of the dielectric constant may be decreased in the dielectric thin film 250 compared to the preliminary dielectric thin film 200, and a range of voltage values at a predetermined dielectric constant may be increased, so that the dielectric thin film 250 may stably have a variable dielectric constant value.

Unlike the above configuration, the first electrode 100 on which the preliminary dielectric thin film 200 is formed may be heat-treated without the forming of the protective layer 300. In other words, when the heat treatment is performed immediately after the preliminary dielectric thin film 200 is prepared on the first electrode 100, the vacancy in the preliminary dielectric thin film 200 may not be passivated. That is, the preliminary dielectric thin film 200 may substantially remain as it is, and thus the vacancy may be removed, so it may not be easy to manufacture the dielectric thin film 250 with the reduced dielectric loss.

However, as described above, according to the embodiment of the present invention, after the protective layer 300 is formed, the preliminary dielectric thin film 200 and the protective layer 300 may be heat-treated, so that the vacancy in the preliminary dielectric thin film 200 may be removed. In other words, the protective layer 300 may prevent the preliminary dielectric thin film 200 from being deoxidized. Accordingly, the vacancy in the preliminary dielectric thin film 200 may be passivated, so that the dielectric thin film 250 stably having a variable dielectric constant value may be formed.

FIG. 5 is a schematic view illustrating a memcapacitor according to an embodiment of the present invention.

Referring to FIG. 5, a memcapacitor including the dielectric thin film 250 which is described above with reference to FIGS. 1 to 5 may be manufactured.

As described above, the dielectric thin film 250 may be manufactured by preparing the protective layer 300 on the preliminary dielectric thin film 200 and performing the heat treatment in the atmosphere including the passivation element.

Accordingly, the memcapacitor may be manufactured by removing the protective layer 300 formed on the dielectric thin film 250 by using an oxidant and forming a second electrode 400 on the dielectric thin film 250 from which the protective layer 300 is removed. For example, the second electrode 400 may include at least one of platinum (Pt), aluminum (Al), cadmium (Cd), cobalt (Co), copper (Cu), iron (Fe), germanium (Ge), indium (In), magnesium (Mg), manganese (Mn), molybdenum (Mo), niobium (Nb), nickel (Ni), lead (Pb), antimony (Sb), selenium (Se), silicon (Si), tin (Sn), tantalum (Ta), tellurium (Te), titanium (Ti), tungsten (W), zinc (Zn), or zirconium (Zr).

In detail, for example, when the oxidant is sodium metaperiodate ($NaIO_4$), the protective layer 300 may be removed by immersing the first electrode 100 on which the protective layer 300 is formed in a solution including the sodium metaperiodate. In addition, for example, the second electrode 400 may be prepared in an inert atmosphere by RF sputtering.

As shown in FIG. 5, the memcapacitor may include the dielectric thin film 250 which is described above with reference to FIGS. 1 to 4. In detail, for example, in the case where the dielectric thin film 250 is strontium manganate, the strontium manganate may include two mutually different stable phases when the strontium manganite is extended by 2%. Accordingly, a phase change may occur due to a change in the applied electric field. For example, the strontium manganate may have a G-type antiferromagnetic-weak ferromagnetic phase at an electric field lower than about 10 meV, and may have a C-type antiferromagnetic-ferromagnetic phase at an electric field greater than about 10 meV. In other words, the memcapacitor including the dielectric thin film 250 having a variable dielectric constant according to the applied electric field may be manufactured.

Hereinafter, a method of manufacturing a dielectric thin film and property evaluation results thereof according to specific examples of the present invention will be described.

Preparation of Dielectric Thin Film According to Example 1-1

Niobium-doped strontium titanate (Nb—$SrTiO_3$) was prepared as the first electrode, and strontium manganate ($SrMnO_3$) was prepared as the target of the preliminary dielectric thin film.

The niobium-doped strontium titanate (001) substrate was washed with isopropyl alcohol (IPA).

The washed substrate was attached to a sample holder by using a silver paste and heat-treated at a temperature of 200° C. for 5 minutes.

A strontium manganate target was loaded into the chamber, and a distance between the target and the substrate was set to 50 mm.

After forming a high vacuum of $3 \times 10^{-6}$ torr in the chamber, a temperature of the sample holder was heated to 900° C.

While increasing the temperature of the sample holder, the oxygen gas was supplied into the chamber at 200 mtorr when the temperature of the sample holder reached 300° C.

When the temperature of the sample holder reached 900° C., a plume (feather-shaped plasma) was adjusted so as to accurately match the substrate for 5 minutes, and preliminary ablation was performed at 20 Hz and 800 pulses.

After the preliminary ablation, a laser pulse of 10 Hz and 1800 pulses was applied to the strontium manganate target for about 3 minutes, so that a dielectric thin film according to Example 1-1 was prepared.

Preparation of Dielectric Thin Film According to Example 1-2

The preparation was performed in the same manner as in Example 1-1 described above, but a heating temperature of the sample holder was changed from 900° C. to 850° C., so that a dielectric thin film according to Example 1-2 was prepared.

Preparation of Dielectric Thin Film According to Example 1-3

The preparation was performed in the same manner as in Example 1-1 described above, but a heating temperature of the sample holder was changed from 900° C. to 800° C., so that a dielectric thin film according to Example 1-3 was prepared.

Preparation of Dielectric Thin Film According to Example 1-4

The preparation was performed in the same manner as in Example 1-1 described above, but the partial pressure of the oxygen gas was changed from 200 mtorr to 150 mtorr, so that a dielectric thin film according to Example 1-4 was prepared.

Preparation of Dielectric Thin Film According to Example 1-5

The preparation was performed in the same manner as in Example 1-1 described above, but the partial pressure of the oxygen gas was changed from 200 mtorr to 100 mtorr, so that a dielectric thin film according to Example 1-5 was prepared.

Preparation of Dielectric Thin Film According to Example 1-6-1

The preparation was performed in the same manner as in Example 1-1 described above, but the first electrode was changed from the niobium-doped strontium titanate (001) to $((LaAlO_3)_{0.3} (Sr_2AlTaO_6)_{0.7}$ (LSAT) (001), so that a dielectric thin film according to Example 1-6-1 was prepared.

Preparation of Dielectric Thin Film According to Example 1-6-2

After the dielectric thin film according to Example 1-6-1 described above was provided in the furnace, the oxygen gas was provided into the furnace at a rate of 2 L/min, and simultaneously a temperature of the furnace was heated to 600° C.

After the heat treatment was performed at a temperature of 600° C. for 2 hours, slow cooling was performed, so that a dielectric thin film according to Example 1-6-2 was prepared.

The process conditions of the dielectric thin films according to Examples 1-1 to 1-5 and Examples 1-6-1 and 1-6-2 described above were listed in <Table 1> below. In this case, unlike the description given with reference to FIGS. 1 to 5, the dielectric thin films according to Examples 1-1 to 1-5 and Examples 1-6-1 and 1-6-2 were prepared without the protective layer.

TABLE 1

| | | Process conditions of preliminary dielectric thin film | | Oxygen heat treatment condition (° C.) |
|---|---|---|---|---|
| | Type of first electrode | Temperature (° C.) | Oxygen partial pressure (mtorr) | |
| Example 1-1 | Nb-STO | 900 | 200 | — |
| Example 1-2 | Nb-STO | 850 | 200 | — |
| Example 1-3 | Nb-STO | 800 | 200 | — |
| Example 1-4 | Nb-STO | 900 | 150 | — |
| Example 1-5 | Nb-STO | 900 | 100 | — |
| Example 1-6-1 | LSAT | 900 | 200 | — |
| Example 1-6-2 | LSAT | 900 | 200 | 600 |

FIG. 6 is a view illustrating X-ray diffraction (XRD) patterns of dielectric thin films according to Examples 1-1 to 1-5 of the present invention.

Referring to FIG. 6, as described above with reference to <Table 1>, the dielectric thin films according to Examples 1-1 to 1-5 were manufactured to have different process temperatures and oxygen partial pressures in preparing of the preliminary dielectric thin film on the first electrode.

However, as shown in FIG. 6, it was observed that the dielectric thin films according to Examples 1-1 to 1-5 have peaks at about 46.5° and about 48.3°. It was observed that the peaks at about 46.5° having higher peak intensity are substantially the same, and the peaks at about 48.3° having lower peak intensity are different from each other in terms of a full width at half maximum (FWHM) but have substantially similar values.

In other words, when the process conditions of the preliminary dielectric thin film are a temperature range of 800 to 900 r, and an oxygen partial pressure of 100 to 200 mtorr, it was observed that the dielectric thin films according to Examples 1-1 to 1-5 have substantially the same crystal structure.

Figure 7:
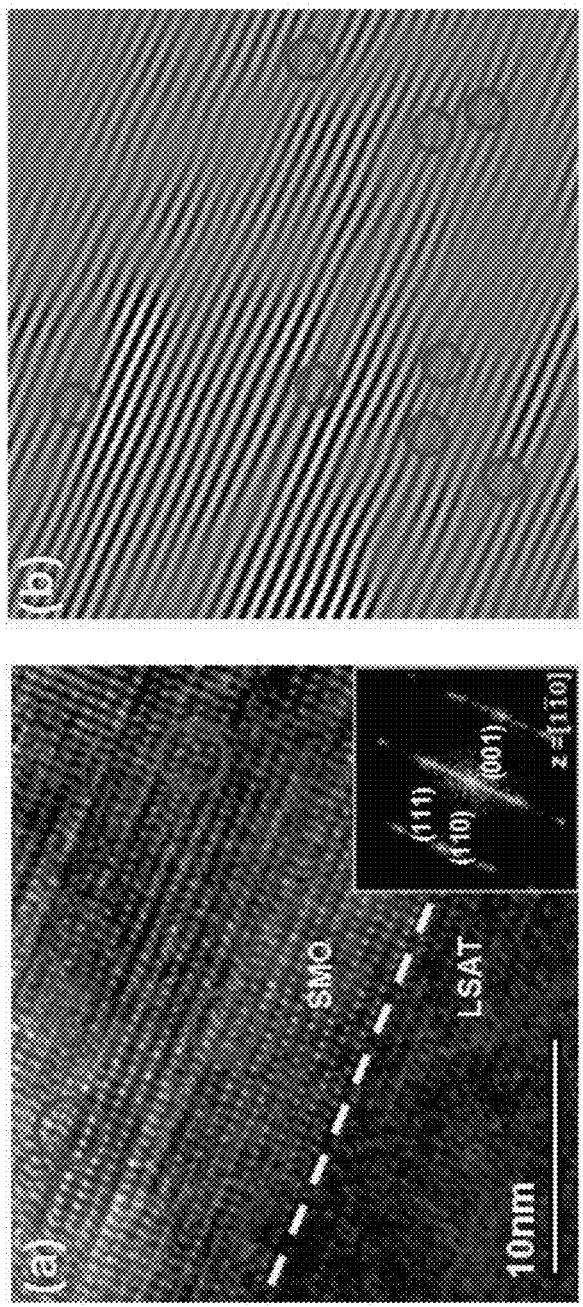
FIG. 7(a) is a view illustrating a transmission electron microscope (TEM) image and FIG. 7(b) is a high resolution transmission electron microscope (HRTEM) image of a dielectric thin film according to Example 1-6-1 of the present invention, FIG. 7(a) also illustrates a Fourier transform pattern of the TEM image of the dielectric thin film according to Example 1-6-1 of the present invention.

FIG. 7 is a view illustrating a transmission electron microscope (TEM) image and a high resolution transmission electron microscope (HRTEM) image of a dielectric thin film according to Example 1-6-1 of the present invention, and FIG. 7(a) illustrates a Fourier transform pattern of the TEM image of the dielectric thin film according to Example 1-6-1 of the present invention.

Referring to FIG. 7, a lattice of the dielectric thin film according to Example 1-6-1 of the present invention, that is, a strontium manganate thin film formed on an LSAT (001) substrate, and a defect in the lattice were observed.

Referring to FIG. 7(a) the drawing inserted in FIG. 7(a), it was observed that the strontium manganate thin film, which is the preliminary dielectric thin film, is epitaxially grown on the LSAT (001) substrate, which is the first electrode.

Referring to FIG. 7(b), it was observed that the preliminary dielectric thin film has dislocation which is a line defect in addition to a point defect shown in FIG. 7(a).

As described above with reference to FIGS. 1 to 4, it was observed that the preliminary dielectric thin film has the intrinsic lattice constant smaller than the lattice constant of the first electrode, so that the lattice of the preliminary dielectric thin film is extended, and the point defect and the line defect are generated in the lattice of the preliminary dielectric thin film.

FIG. 8 is a view illustrating the XRD pattern of the dielectric thin film according to Example 1-1 of the present invention, and FIG. 9 is a view illustrating a reciprocal space map (RSM) result of the dielectric thin film according to Example 1-1 of the present invention.

Referring to FIGS. 8 and 9, a crystal structure and a lattice constant of the dielectric thin film according to Example 1-1 of the present invention were observed.

As can be seen in FIG. 8(a), it was observed that the strontium manganate thin film (i.e., the preliminary dielectric thin film) is prepared on the niobium-doped strontium titanate substrate (i.e., the first electrode) to have the same crystal direction. In other words, it was observed that the preliminary dielectric thin film is epitaxially grown on the first electrode. In addition, referring to FIG. 8(b), it was observed that a full width at half maximum (FWHM) of the peak of the preliminary dielectric thin film is 0.100°.

Referring to FIG. 9(a), as described above with reference to FIG. 8, it was observed that a peak of the first electrode having the maximum intensity and a peak of the preliminary dielectric thin film having the maximum intensity are the same. Accordingly, it was observed that the preliminary dielectric thin film is epitaxially formed on the first electrode.

In this case, it was observed that an H 0 0 value of a (103) peak of the preliminary dielectric thin film is [1.005 0 3.12]. It was observed that a c-lattice constant of the preliminary dielectric thin film is 0.3886 nm based on the H value (i.e., 1.005). Accordingly, it was observed that the c-lattice constant of the preliminary dielectric thin film is extended by about 2% based on the value of 0.3805, which is an intrinsic c-lattice constant of the preliminary dielectric thin film.

FIGS. 10 and 11 are views illustrating XRD patterns according to thicknesses of dielectric thin films according to Examples 1-6-1 and 1-6-2 of the present invention.

Referring to FIGS. 10 and 11, in the dielectric thin films according to Examples 1-6-1 and 1-6-2 of the present invention, thicknesses of the preliminary dielectric thin films and crystal structures before and after oxygen heat treatment were observed.

As shown in FIGS. 10 and 11, it was observed that when the thicknesses of the preliminary dielectric thin films are increased in the dielectric thin films according to Examples 1-6-1 and 1-6-2, the peak of the preliminary dielectric thin film is increased while a position of the peak is constant.

In addition, it was observed that the position of the peak of the preliminary dielectric thin film does not change substantially before and after the heat treatment of the preliminary dielectric thin film.

Accordingly, as described above with reference to FIGS. 1 to 4, it was observed that when the oxygen heat treatment is performed without the forming of the protective layer on the preliminary dielectric thin film, that is, when the oxygen heat treatment is performed immediately after forming the preliminary dielectric thin film, the vacancy of the preliminary dielectric thin film is not passivated.

FIGS. 12 and 13 are views illustrating dielectric constants and loss tangents (tangent delta) according to voltages applied to the dielectric thin film according to Example 1-1 of the present invention.

Referring to FIGS. 12 and 13, as described above with reference to FIGS. 1 to 4 and 11, it was observed that the dielectric thin film according to Example 1-1 where the protective layer is not formed have no change in the crystal structure before and after the oxygen heat treatment. In other words, it was observed that even if the dielectric thin film according to Example 1-1 is subjected to the oxygen heat treatment, the dielectric thin film according to Example 1-1 may have a crystal structure substantially the same as the crystal structure before the oxygen heat treatment. Accordingly, it was observed that the dielectric thin film according to Example 1-1 has a dielectric constant the same as the dielectric constant before the oxygen heat treatment.

Accordingly, as shown in FIGS. 12 and 13, the dielectric constants and the loss tangents of the dielectric thin film according to Example 1-1, which was not subjected to the oxygen heat treatment, according to the applied electric field were observed.

As shown in FIG. 12, it was observed that the dielectric thin film according to Example 1-1 has mutually different dielectric constants in ranges of about −6 V or less, about 1 to 2 V, and about 10 V or more. In other words, it was observed that the dielectric thin film according to Example 1-1 has at least three dielectric constants.

Referring to FIG. 13, generally, the loss tangent represents a value of the voltage relative to the current, that is, a resistance in a voltage-current graph, and specifically, the loss tangent represents a loss ratio in a capacitance due to the resistance.

As described above with reference to FIGS. 1 to 4, the preliminary dielectric thin film has a phase change according to the applied electric field, and thus the preliminary dielectric thin film may a variable capacitance. Therefore, referring to FIG. 13, it was observed that the dielectric thin film according to Example 1-1 has a loss of the capacitance due to the lowest resistance in an applied voltage range of about −4 to 2 V.

Preparation of Dielectric Thin Film According to Example 2-1-1

The preparation was performed in the same manner as in Example 1-1 described above, but the strontium ruthenate ($SrRuO_3$) target was further provided into the target of the protective layer in the chamber in the loading of the strontium manganate target into the chamber.

Accordingly, the strontium manganate thin film was prepared on the niobium-doped strontium titanate (001) substrate.

After preparing the strontium manganate thin film, the temperature of the sample holder was reduced to 30° C./min, and simultaneously, the partial pressure of the oxygen gas in the chamber was changed from 200 mtorr to 100 mtorr.

When the temperature of the sample holder reached 750° C., the plume was adjusted so as to accurately match the substrate for 5 minutes, and second preliminary ablation was performed at 20 Hz and 500 pulses.

After the second preliminary ablation, a laser pulse of 3 Hz and 1820 pulses was applied to the strontium ruthenate target for about 10 to 11 minutes, so that a dielectric thin film according to Example 2-1-1 was prepared.

Preparation of Dielectric Thin Film According to Example 2-2-1

The preparation was performed in the same manner as in Example 2-1-1 described above, but the first electrode was changed from the niobium-doped strontium titanate (001) to (($LaAlO_3$)$_{0.3}$ ($Sr_2AlTaO_6$)$_{0.7}$ (LSAT) (001) so that a dielectric thin film according to Example 2-2-1 was prepared.

Preparation of Dielectric Thin Film According to Example 2-1-2

The preparation was performed in the same manner as in Example 1-6-2 described above, but the dielectric thin film according to Example 2-1-1 was used instead of the dielectric thin film according to Example 1-6-1, so that a dielectric thin film according to Example 2-1-2 was prepared.

Preparation of Dielectric Thin Film According to Example 2-2-2

The preparation was performed in the same manner as in Example 1-6-2 described above, but the dielectric thin film according to Example 2-2-1 was used instead of the dielectric thin film according to Example 1-6-1, so that a dielectric thin film according to Example 2-2-2 was prepared.

The process conditions of the dielectric thin films according to Examples 2-1-1 and 2-2-1 and Examples 2-1-2 and 2-2-2 described above were listed in <Table 2> below. In this case, unlike the dielectric thin films according to Examples 1-1 to 1-5, and Examples 1-6-1 and 1-6-2, the dielectric thin films according to Examples 2-1-1 and 2-2-1 and Examples 2-1-2 and 2-2-2 described above were prepared to further include the protective layer on the preliminary dielectric thin film.

TABLE 2

| | Type of first electrode | Process conditions of preliminary dielectric thin film | | Oxygen heat treatment condition (° C.) |
| --- | --- | --- | --- | --- |
| | | Temperature (° C.) | Oxygen partial pressure (mtorr) | |
| Example 2-1-1 | Nb-STO | 900 | 200 | — |
| Example 2-2-1 | LSAT | 900 | 200 | — |
| Example 2-1-2 | Nb-STO | 900 | 200 | 600 |
| Example 2-2-2 | LSAT | 900 | 200 | 600 |

Figure 15:
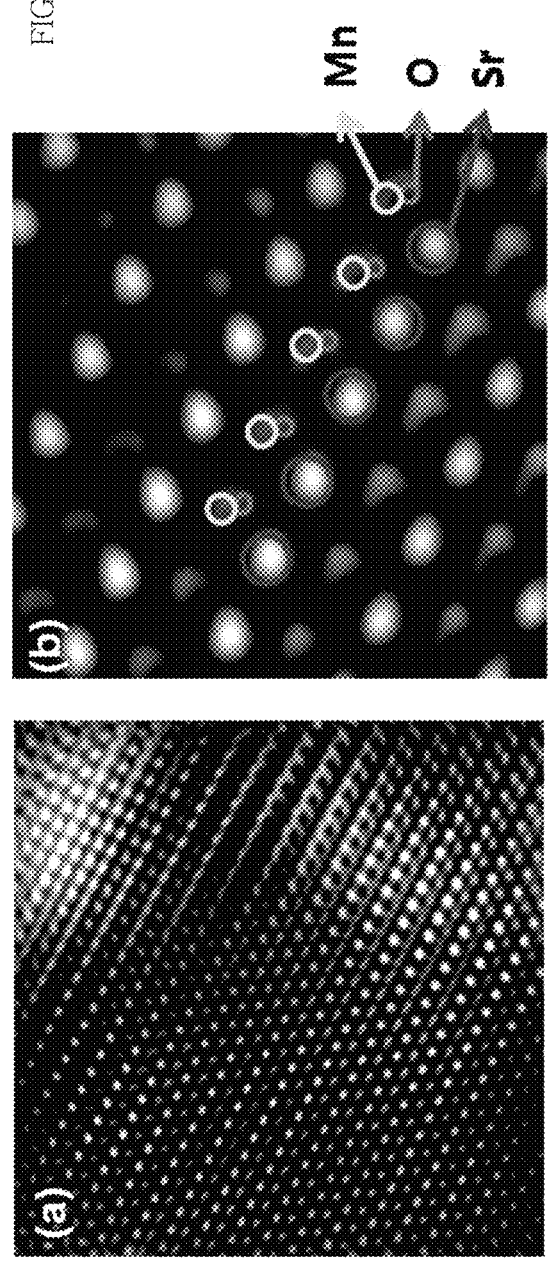

FIGS. 14 and 15 are views illustrating a TEM image, a Fourier transform pattern of the TEM image, and an annular bright-field image of a dielectric thin film according to Example 2-2-2 of the present invention.

Referring FIGS. 14 and 15, a lattice and a crystal structure of the dielectric thin film according to Example 2-2-2 of the present invention were observed.

As shown in FIG. 14, it was observed that the strontium manganate thin film, which is the dielectric thin film, is formed on the LSAT (001) substrate, which is the first electrode, and a strontium ruthenate thin film is formed on the strontium manganate thin film to serve as the protective layer. In this case, it was observed that unlike the first electrode and the preliminary dielectric thin film formed on the first electrode shown in FIG. 7(a), no point defect is observed in a structure in which the first electrode, the dielectric thin film, and the protective layer are sequentially prepared.

In addition, it was observed that a Fourier transform pattern of the dielectric thin film shown in FIG. 14 and a Fourier transform pattern of the protective layer shown in FIG. 14 are substantially the same.

Accordingly, it was observed that the epitaxially growth is achieved substantially without the point defect between the first electrode and the dielectric thin film, and between the dielectric thin film and the protective layer. In other words, as described above with reference to FIGS. 1 to 4, the dielectric thin film may be manufactured by forming the protective layer on the preliminary dielectric thin film and performing the oxygen heat treatment on the preliminary dielectric thin film. In this case, the vacancy that may cause a defect in the preliminary dielectric thin film may be passivated. Accordingly, as shown in FIG. 14, the dielectric thin film which has substantially no point defect and is epitaxially grown may be manufactured.

Referring to FIG. 15, arrangement of strontium, manganese, and oxygen elements in a [110] direction of the dielectric thin film described above with reference to FIG. 14 was observed.

In detail, referring to FIG. 15(b), an enlarged view of the annular bright-field image of the dielectric thin film shown in FIG. 15(a) was observed.

In general, the perovskite in the [110] direction may overlap a central metal and the oxygen element. However, as shown in FIG. 15(b), it was observed that manganese, which is the central metal, does not overlap the oxygen element in the dielectric thin film. In other words, it was observed that the manganese and oxygen elements deviate from a symmetrical position in the dielectric thin film, and the manganese is moved in the [110] direction in the dielectric thin film.

FIGS. 16 and 17 are views illustrating XRD patterns according to thicknesses of dielectric thin films according to Examples 2-1-1 and 2-2-2 of the present invention.

Referring to FIGS. 16 and 17, the thicknesses of the dielectric thin films and crystal structures before and after the oxygen heat treatment in the dielectric thin films according to Examples 2-1-1 and 2-2-2 of the present invention were observed.

As described above with reference to FIGS. 10 and 11, it was observed that the intensity of the peak of the dielectric thin film is increased as the thickness of the dielectric thin film increases.

In addition, as shown in FIGS. 16 and 17, it was observed that the dielectric thin film in which the vacancy is passivated by the oxygen heat treatment performed on the preliminary dielectric thin film is manufactured, and the position of the peak of the strontium manganate is changed. In other words, it was observed that a position of the peak of the dielectric thin film according to Example 2-2-2 is increased from about 48° to about 48.3° based on the dielectric thin film according to Example 2-1-2.

Accordingly, as described above with reference to FIGS. 1 to 4, in the above dielectric thin film, the vacancy may be passivated and the extend lattice may be released as compared with the preliminary dielectric thin film. Therefore, it was observed that c-lattice contraction occurs, whereby the position of the peak is changed.

FIG. 18 is a view illustrating a voltage versus a current density according to thicknesses of dielectric thin films according to Examples 2-2-1 and 2-2-2 of the present invention.

Referring to FIG. 18, it was observed that as the thicknesses of the dielectric thin films according to Examples 2-2-1 and 2-2-2 of the present invention increase, a current density of the dielectric thin film according to a voltage is reduced.

In addition, it was observed that the dielectric thin film according to Example 2-2-2 has a lower current density than the dielectric thin film according to Example 2-2-1 at the same thickness. As described above with reference to FIGS. 1 to 4, the dielectric thin film according to Example 2-2-2 may be manufactured by performing the oxygen heat treatment on the dielectric thin film according to Example 2-2-1. Accordingly, it was observed that the vacancy is further passivated in the dielectric thin film according to Example 2-2-2 as compared with the dielectric thin film according to Example 2-2-1, so that a carrier exhibiting electrical conductivity is reduced, which causes a low current density.

In detail, the current density of the dielectric thin film before and after the oxygen heat treatment was listed in <Table 3> below.

TABLE 3

|  | Current density (A/cm$^2$) at 5 V |
| --- | --- |
| Example 2-2-1(20 nm) | 180 |
| Example 2-2-2(20 nm) | $3.8 \times 10^{-6}$ |
| Example 2-2-1(115 nm) | 29 |
| Example 2-2-2(115 nm) | $6.9 \times 10^{-8}$ |

As can be seen in <Table 3> and FIG. 18, when the thickness of the dielectric thin film is 20 nm, it was observed that the dielectric thin film after the oxygen heat treatment (i.e., Example 2-2-2) has a current density reduced by about 106 times as compared with the dielectric thin film before the oxygen heat treatment (i.e., Example 2-2-1). In addition, when the thickness of the dielectric thin film is 115 nm, it was observed that the dielectric thin film after the oxygen heat treatment (i.e., Example 2-2-2) has a current density reduced by about 108 times as compared with the dielectric thin film before the oxygen heat treatment (i.e., Example 2-2-1).

Accordingly, it was observed that a leakage current of the dielectric thin film is reduced by the oxygen heat treatment.

FIG. 19 is a view illustrating a voltage versus a dielectric loss according to the thicknesses of the dielectric thin films according to Examples 2-2-1 and 2-2-2 of the present invention.

Referring to FIG. 19, it was observed that the dielectric thin film according to Example 2-2-1 has a large dielectric loss as the thickness thereof is reduced. Meanwhile, it was observed that the dielectric thin film according to Example 2-2-2 has a substantially constant dielectric loss regardless of the thickness. Accordingly, it was observed that the vacancy existing in the dielectric thin film according to Example 2-2-2 is passivated by the oxygen heat treatment even if the thickness of the dielectric thin film is increased.

In addition, it was observed that the dielectric thin film according to Example 2-2-2 has a lower dielectric loss than the dielectric thin film according to Example 2-2-1 at the same thickness. As described above with reference to FIG. 18, the vacancy of the dielectric thin film according to Example 2-2-2 may be further passivated as compared with the vacancy of the dielectric thin film according to Example 2-2-1. Accordingly, it was observed that a concentration of the carrier exhibiting the electrical conductivity is reduced, so that the dielectric loss is reduced.

FIGS. 20 and 21 are views illustrating a dielectric constant and a loss tangent according to a voltage of a dielectric thin film according to Example 2-1-2 of the present invention.

Referring to FIGS. 20 and 21, the dielectric thin film according to Example 2-1-2 was manufactured by preparing the protective layer on the dielectric thin film according to Example 1-1 described above with reference to FIGS. 12 and 13, and performing the oxygen heat treatment.

As shown in FIG. 20, it was observed that the dielectric thin film according to Example 2-1-2 has at least three dielectric constants, similarly to the dielectric thin film according to Example 1-1 shown in FIG. 12. In other words, mutually different dielectric constants were identified in ranges of about −5 V or less, about 0 to 5 V, and about 5 V or more.

In the dielectric thin film according to Example 1-1 and the dielectric thin film according to Example 2-1-2, the dielectric constants of the dielectric thin films were observed in substantially similar voltage ranges. In other words, a leakage current region shown as region (A) of FIG. 20 was also observed in the similar voltage range.

Meanwhile, it was observed that the dielectric constant of the dielectric thin film according to Example 2-1-2 is higher than the dielectric constant according to Example 1-1 in each of the voltage ranges. In addition, it was observed that a degree of modulation in the dielectric constant at 0 V to 5 V is lower in the dielectric thin film according to Example 2-1-2 as compared with the dielectric thin film according to Example 1-1, and it was observed that the dielectric constant at 5 V or more becomes constant at a lower voltage in the dielectric thin film according to Example 2-1-2 as compared with the dielectric thin film according to Example 1-1. Accordingly, it was observed that the dielectric thin film according to Example 2-1-2 is stabilized by the oxygen heat treatment as compared with the dielectric thin film according to Example 1-1.

Referring to FIG. 21, as described above with reference to FIG. 13, it was observed that the dielectric thin film according to Example 2-1-2 has a loss of a capacitance due to the lowest resistance in a voltage range of about −5 V to about 2V. Meanwhile, it was observed that the dielectric thin film according to Example 2-1-2 has a substantially lower loss tangent than the dielectric thin film according to Example 1-1.

FIGS. 22 and 23 are views illustrating dielectric constants and loss tangents according to voltages of the dielectric thin films according to Examples 1-1 to 1-5 and Example 2-1-2 of the present invention.

Referring to FIGS. 22 and 23, loss tangents of the dielectric thin films according to Examples 1-1 to 1-5 and Example 2-1-2 prepared under mutually different conditions described above with reference to <Table 1> and <Table 2> were listed in <Table 4>.

TABLE 4

|  | Loss tangent (tan δ) |
| --- | --- |
| Example 1-1 | 0.188 |
| Example 1-2 | 0.155 |
| Example 1-3 | 0.162 |
| Example 1-4 | 0.228 |
| Example 1-5 | 0.187 |
| Example 2-1-2 | 0.237 |

As can be seen in <Table 4> and FIGS. 22 and 23, as described above with reference to FIGS. 20 and 21, it was observed that the dielectric thin film according to Example 2-1-2 has a substantially higher dielectric constant and a substantially lower loss tangent as compared with the dielectric thin films according to Examples 1-1 to 1-5.

In other words, it was observed that the dielectric thin film has substantially more stable dielectric properties due to the oxygen heat treatment.

FIG. 24 is a view illustrating a dielectric constant according to a time of the dielectric thin film according to Example 2-1-2 of the present invention.

Referring to FIG. 24, as described above with reference to FIG. 20, a change of the dielectric constant according to a time was observed by applying a voltage at which each of the dielectric constants of the dielectric thin film according to Example 2-1-2 of the present invention is observed.

As described above with reference to FIG. 20, it was observed that the dielectric thin film according to Example 2-1-2 has at least three dielectric constants. As shown in FIG. 24, a dielectric constant was observed to be about 150% at 0.1 V as compared with −6 V, a dielectric constant was observed to be 180% at 3 V as compared with −6 V, and a dielectric constant was observed to be 400% at 10 V as compared with −6 V.

As shown in FIG. 24, it was observed that the dielectric thin film according to Example 2-1-2 has a dielectric constant which is constant at each voltage for at least 1000 seconds.

FIG. 25 is a block diagram schematically illustrating one example of an electronic system including a memcapacitor based on the technical idea of the present invention.

Referring to FIG. 25, an electronic system 1100 according to an embodiment of the present invention may include a controller 1110, an input/output device (I/O) 1120, a memory device 1130, an interface 1140, and a bus 1150. The controller 1110, the input/output device 1120, the memory device 1130, and/or the interface 1140 may be coupled to each other through the bus 1150. The bus 1150 may be a path through which data is moved.

The controller 1110 may include at least one of a microprocessor, a digital signal process, a microcontroller, and logic elements capable of performing functions similar thereto. The input/output device 1120 may include a keypad, a keyboard, a display device, and the like. The memory device 1130 may store data and/or a command. The memory device 1130 may include at least one of the memcapacitors according to the above-described embodiments of the present invention. In addition, the memory device 1130 may further include other types of semiconductor memory devices (e.g., DRAM devices and/or SRAM devices).

The interface 1140 may perform a function of transmitting data to a communication network or receiving the data from the communication network. The interface 1140 may be configured in a wired or wireless form. For example, the interface 1140 may include an antenna, a wired/wireless transceiver, or the like. Although not shown, the electronic system 1100 may further include a high-speed DRAM and/or SRAM as an operation memory for improving an operation of the controller 1110.

The electronic system 1100 may be applied to a personal digital assistant (PDA), a portable computer, a web tablet, a wireless phone, a mobile phone, a digital music player, a memory card, or any electronic device that may transmit and/or receive information in a wireless environment.

FIG. 26 is a block diagram schematically illustrating one example of a memory card including the memcapacitor based on the technical idea of the present invention.

Referring to FIG. 26, a memory card 1200 according to one embodiment may include a memory device 1210, and the memory device 1210 may include at least one of the memcapacitors according to the above-described embodiments of the present invention. In addition, the memory device 1210 may further include other types of semiconductor memory devices (e.g., DRAM devices and/or SRAM devices). The memory card 1200 may include a memory controller 1220 configured to control data exchange between a host and the memory device 1210.

The memory controller 1220 may include a processing unit 1222 configured to control an overall operation of the memory card. In addition, the memory controller 1220 may include an SRAM 1221 used as an operation memory of the processing unit 1222. Further, the memory controller 1220 may further include a host interface 1223 and a memory interface 1225.

The host interface 1223 may include a data exchange protocol between the memory card 1200 and the host. The memory interface 1225 may connect the memory controller 1220 to the memory device 1210. Furthermore, the memory controller 1220 may further include an error correction block (ECC) 1224.

The error correction block 1224 may detect and correct an error of the data read from the memory device 1210. Although not shown, the memory card 1200 may further include a ROM device configured to store code data for interfacing with the host. The memory card 1200 may be used as a portable data storage card. Alternatively, the memory card 1200 may be implemented as a solid state disk (SSD) that may replace a hard disk of a computer system.

Although the exemplary embodiments of the present invention have been described in detail as described above, the scope of the present invention is not limited to a specific embodiment, and should be interpreted by the appended claims. Further, it should be understood by those skilled in the art to which the invention pertains that various changes and modifications can be made without departing from the scope of the present invention.

What is claimed is:

1. A method of manufacturing a dielectric thin film, the method comprising:
preparing a preliminary dielectric thin film having a lattice constant which is extended as compared with an intrinsic lattice constant thereof, having a dielectric loss which is increased due to extension of the intrinsic lattice constant, and having a perovskite composition and crystal structure;
forming a protective layer on the preliminary dielectric thin film, the protective layer having a perovskite composition and having a same crystal structure as the preliminary dielectric thin film;
forming a dielectric thin film in which a passivation element is provided, the dielectric thin film being formed by heat-treating the preliminary dielectric thin film and the protective layer in a gas atmosphere including the passivation element; and
removing the protective layer from the preliminary dielectric thin film after heat-treating the preliminary dielectric thin film and the protective layer.

2. The method of claim 1, wherein the passivation element reduces a dielectric loss due to extension of the intrinsic lattice constant so that the dielectric thin film has a dielectric loss lower than the dielectric loss of the preliminary dielectric thin film.

3. The method of claim 1, wherein the preliminary dielectric film comprises $SrMnO_3$ and the protective layer comprises $SrRuO_3$.

4. The method of claim 1, wherein preparing the preliminary dielectric thin film includes:
preparing a first electrode having a lattice constant greater than the lattice constant of the preliminary dielectric thin film; and
preparing the preliminary dielectric thin film having the lattice constant which is extended as compared with the intrinsic lattice constant thereof by epitaxially growing the preliminary dielectric thin film on the first electrode.

5. The method of claim 4, wherein the preliminary dielectric thin film and the protective layer are formed by a pulse laser deposition scheme.

6. A method of manufacturing a memcapacitor, the method comprising:
forming the dielectric thin film on the first electrode according to claim 4;
forming a second electrode on the dielectric thin film.

7. The method of claim 6, wherein the first electrode comprises $Nb\text{-}SrTiO_3$ and the preliminary dielectric thin film comprises $SrMnO_3$.

* * * * *